US012666989B2

(12) United States Patent
Kim et al.

(10) Patent No.: US 12,666,989 B2
(45) Date of Patent: Jun. 23, 2026

(54) SEMICONDUCTOR PACKAGE

(71) Applicant: Samsung Electronics Co., Ltd.,
Suwon-si (KR)

(72) Inventors: Young Lyong Kim, Anyang-si (KR);
Hyunsoo Chung, Hwaseong-si (KR)

(73) Assignee: Samsung Electronics Co., Ltd.,
Gyeonggi-do (KR)

( * ) Notice: Subject to any disclaimer, the term of this
patent is extended or adjusted under 35
U.S.C. 154(b) by 702 days.

(21) Appl. No.: 17/712,358

(22) Filed: Apr. 4, 2022

(65) Prior Publication Data

US 2023/0035026 A1        Feb. 2, 2023

(30) Foreign Application Priority Data

Jul. 29, 2021        (KR) ........................ 10-2021-0099837

(51) Int. Cl.
H10W 70/685        (2026.01)
H10W 70/60        (2026.01)
(Continued)

(52) U.S. Cl.
CPC ........ H10W 70/685 (2026.01); H10W 74/111
(2026.01); H10W 90/00 (2026.01);
(Continued)

(58) Field of Classification Search
CPC . H01L 2225/06562; H01L 2225/06565; H01L
2224/97; H01L 2224/96; H01L
2224/73253; H01L 2224/17517; H01L
2224/1403; H01L 2224/14051; H01L
2225/06513; H01L 2224/091; H01L
2224/023; H01L 24/17; H01L
2224/13099;
(Continued)

(56) References Cited

U.S. PATENT DOCUMENTS 7,691,670 B2        4/2010    Eslamy et al.
7,768,119 B2        8/2010    Chia
(Continued)

FOREIGN PATENT DOCUMENTS

KR            100876889 B1        1/2009
KR        10-2012-0005340 A        1/2012
(Continued)

*Primary Examiner* — Jessica S Manno
*Assistant Examiner* — Victor Joseph Lasasso
(74) *Attorney, Agent, or Firm* — Harness, Dickey &
Pierce, P.L.C.

(57)        ABSTRACT

A semiconductor package includes a first semiconductor
chip on a package substrate, a second semiconductor chip on
the first semiconductor chip and having a redistribution layer
on a bottom surface thereof, under-bump pads on a bottom
surface of the redistribution layer, first solders adjacent to
the first semiconductor chip and connecting first pads of the
under-bump pads to substrate pads of the package substrate,
and a molding layer on the package substrate and covering
the first and second semiconductor chips and the first
solders. Second pads of the under-bump pads are in direct
contact with a top surface of the first semiconductor chip.
The first pads are connected through the redistribution layer
to an integrated circuit of the second semiconductor chip.
The second pads are insulated from the integrated circuit of
the second semiconductor chip.

20 Claims, 19 Drawing Sheets

(51) Int. Cl.
| | |
|---|---|
| *H10W 72/90* | (2026.01) |
| *H10W 74/10* | (2026.01) |
| *H10W 80/00* | (2026.01) |
| *H10W 90/00* | (2026.01) |

(52) U.S. Cl.
CPC ........ *H10W 70/60* (2026.01); *H10W 72/9445* (2026.01); *H10W 80/743* (2026.01); *H10W 90/724* (2026.01)

(58) Field of Classification Search
CPC ..... H01L 2224/16225; H01L 2224/171; H01L 2224/32014; H01L 2224/32145; H01L 2224/81801; H01L 2225/06517; H01L 2225/06527; H01L 2225/06572; H01L 23/3128; H01L 24/06; H01L 24/14; H01L 24/73; H01L 24/81; H01L 25/0657; H01L 25/105; H01G 4/232; H01G 4/40; H10W 70/60; H10W 90/724; H10W 90/00; H10W 90/722; H10W 90/734; H10W 72/0198; H10W 72/884; H10W 72/073; H10W 72/072; H10W 74/117; H10W 90/291; H10W 74/00; H10W 90/732; H10W 90/754

See application file for complete search history.

(56) References Cited

U.S. PATENT DOCUMENTS

| | | | |
|---|---|---|---|
| 7,825,504 | B2 | 11/2010 | Kim |
| 7,952,028 | B2 | 5/2011 | Uno et al. |
| 8,120,154 | B2 | 2/2012 | Eslamy et al. |
| 8,232,655 | B2 | 7/2012 | Arvin et al. |
| 8,558,380 | B2 | 10/2013 | Kim et al. |
| 8,952,516 | B2 | 2/2015 | Zohni et al. |
| 9,252,095 | B2 | 2/2016 | Kim et al. |
| 9,595,513 | B2 | 3/2017 | Fogal et al. |
| 9,793,198 | B2 | 10/2017 | Uzoh et al. |
| 10,163,877 | B2 | 12/2018 | Wang et al. |
| 10,714,401 | B2 | 7/2020 | Jang |
| 2009/0001542 | A1* | 1/2009 | Kim .................... H01L 23/3128 257/738 |
| 2009/0057864 | A1* | 3/2009 | Choi ..................... H01L 25/105 438/109 |
| 2010/0314736 | A1* | 12/2010 | Ko ......................... H01L 25/105 438/108 |
| 2011/0248389 | A1 | 10/2011 | Yorita et al. |
| 2015/0035148 | A1 | 2/2015 | Lee et al. |
| 2017/0221866 | A1 | 8/2017 | Cho |
| 2018/0053705 | A1* | 2/2018 | Wang .................... H01L 25/105 |
| 2020/0015260 | A1 | 1/2020 | Chen et al. |
| 2020/0152601 | A1 | 5/2020 | Igarashi |
| 2020/0273800 | A1* | 8/2020 | Kim .................... H01L 23/5386 |
| 2020/0273801 | A1 | 8/2020 | Kim et al. |
| 2021/0013180 | A1 | 1/2021 | Seo et al. |
| 2021/0111124 | A1 | 4/2021 | Elsherbini et al. |
| 2021/0111153 | A1 | 4/2021 | Lin et al. |
| 2021/0111156 | A1 | 4/2021 | Elsherbini et al. |
| 2022/0352124 | A1 | 11/2022 | Kim |
| 2022/0415809 | A1 | 12/2022 | Kim et al. |

FOREIGN PATENT DOCUMENTS

| | | |
|---|---|---|
| KR | 2020-0027603 A | 3/2020 |
| KR | 20210000812 A | 1/2021 |
| KR | 20210013429 A | 2/2021 |
| KR | 2021-0075353 A | 6/2021 |
| KR | 2021-0090522 A | 7/2021 |
| KR | 10-2022-0150075 A | 11/2022 |
| KR | 10-2023-0000725 A | 1/2023 |
| TW | 202030847 A | 8/2020 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2021-0099837 filed on Jul. 29, 2021 in the Korean Intellectual Property Office, the disclosure of which is hereby incorporated by reference in its entirety.

BACKGROUND

The present inventive concepts relate to a semiconductor package and a method of fabricating the same.

Portable devices have been increasingly demanded in recent electronic product markets, and as a result, it has been ceaselessly required for reduction in size and weight of electronic parts mounted on the portable devices. In particular, there is a continuous increase in need for excellent performance memory devices, and it is required to achieve high bandwidth or high processing capacity.

In order to accomplish the reduction in size and weight of the electronic parts, there is need for technology to integrate a number of individual devices into a single package as well as technology to reduce individual sizes of mounting parts. In particular, semiconductor packages operated at high frequency signals are required to have compactness and excellent electrical characteristics.

In general, a TSV process, a flip chip process, and a wire bonding process may be employed to stack a plurality of memory chips on a package substrate. However, there is a problem that the TSV process may be complex and excessively expensive.

SUMMARY

Some example embodiments of the present inventive concepts provide a semiconductor package with improved structural stability.

Some example embodiments of the present inventive concepts provide a semiconductor package with increased electrical properties.

Some example embodiments of the present inventive concepts provide a compact-sized semiconductor package.

Some example embodiments of the present inventive concepts provide a semiconductor package having memory chips stacked on a package substrate, there the memory chips may be so stacked with reduced complexity and costs in relation to complexity and costs associated with a TSV process.

Some example embodiments of the present inventive concepts provide a method of fabricating a semiconductor package according to any of the example embodiments. Such a method may address complexity of processes to stack a plurality of memory chips on a package substrate and may provide a semiconductor package having memory chips stacked on a package substrate with reduced complexity and costs in relation to complexity and costs associated with a TSV process.

According to some example embodiments of the present inventive concepts, a semiconductor package may comprise: a first semiconductor chip on a package substrate; a second semiconductor chip on the first semiconductor chip, the second semiconductor chip having a redistribution layer on a bottom surface of the second semiconductor chip; a plurality of under-bump pads on a bottom surface of the redistribution layer; a plurality of first solders adjacent to the first semiconductor chip, the first solders connecting a plurality of first pads of the under-bump pads to a plurality of substrate pads of the package substrate; and a molding layer on the package substrate, the molding layer covering the first semiconductor chip, the second semiconductor chip, and the first solders. A plurality of second pads of the under-bump pads may be in direct contact with a top surface of the first semiconductor chip. The first pads may be connected through the redistribution layer to an integrated circuit of the second semiconductor chip. The second pads may be insulated from the integrated circuit of the second semiconductor chip.

According to some example embodiments of the present inventive concepts, a semiconductor package may comprise: a package substrate; a first semiconductor chip and a second semiconductor chip that are sequentially stacked on the package substrate; a molding layer on the package substrate, the molding layer covering the first semiconductor chip and the second semiconductor chip; and a plurality of external terminals on a bottom surface of the package substrate. The second semiconductor chip may be offset from the first semiconductor chip in a horizontal direction that is parallel to at least a top surface of the package substrate to vertically overlap a first lateral surface and a second lateral surface of the first semiconductor chip. The first and second lateral surfaces may be adjacent to each other. The first semiconductor chip may be mounted on the package substrate through a plurality of first solders on the bottom surface of the first semiconductor chip such that the plurality of first solders are between the first semiconductor chip and the package substrate. The second semiconductor chip may be mounted on the package substrate through a plurality of second solders on the package substrate such that the plurality of second solders are between the second semiconductor chip and the package substrate. The second solders may be adjacent to the first lateral surface and the second lateral surface of the first semiconductor chip and may be spaced apart from the first semiconductor chip. The second semiconductor chip may be supported on a top surface of the first semiconductor chip.

According to some example embodiments of the present inventive concepts, a semiconductor package may comprise: a substrate; a first semiconductor chip that is flip-chip mounted on the substrate; a second semiconductor chip on the first semiconductor chip and horizontally offset from the first semiconductor chip in a horizontal direction that is parallel to at least a top surface of the substrate; a redistribution layer on a bottom surface of the second semiconductor chip and connected to an integrated circuit of the second semiconductor chip; a dummy pad between the first semiconductor chip and the second semiconductor chip and on a bottom surface of the redistribution layer; a signal pad on one side of the first semiconductor chip and on the bottom surface of the redistribution layer; a connection terminal on the one side of the first semiconductor chip and between the substrate and the second semiconductor chip; and a molding layer on the substrate and covering the first semiconductor chip and the second semiconductor chip, the molding layer filling a space between the substrate and the first semiconductor chip and a space between the substrate and the second semiconductor chip. The connection terminal may directly connect the signal pad to a substrate pad of the substrate.

DETAILED DESCRIPTION

Figure 1:
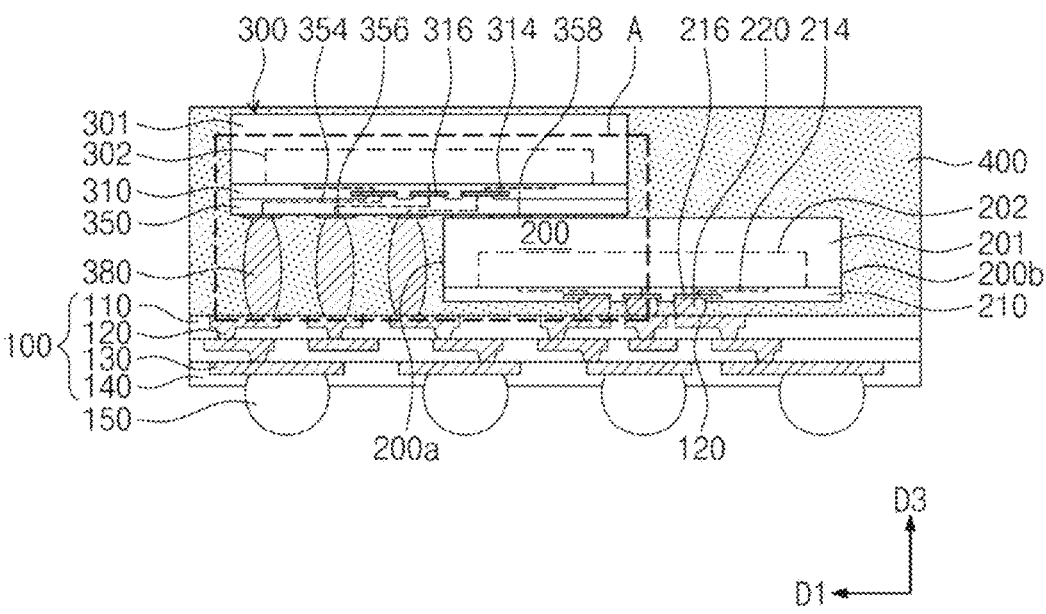
FIG. 1 illustrates a cross-sectional view showing a semiconductor package according to some example embodiments of the present inventive concepts.

The following will now describe a semiconductor package according to the present inventive concepts with reference to the accompanying drawings.

In the description of FIGS. 1 to 22, the same reference numerals are used for substantially the same components, and duplicate descriptions of the corresponding components will be omitted. Also, similar reference numerals are used for similar components throughout various drawings of the present inventive concepts.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 2:
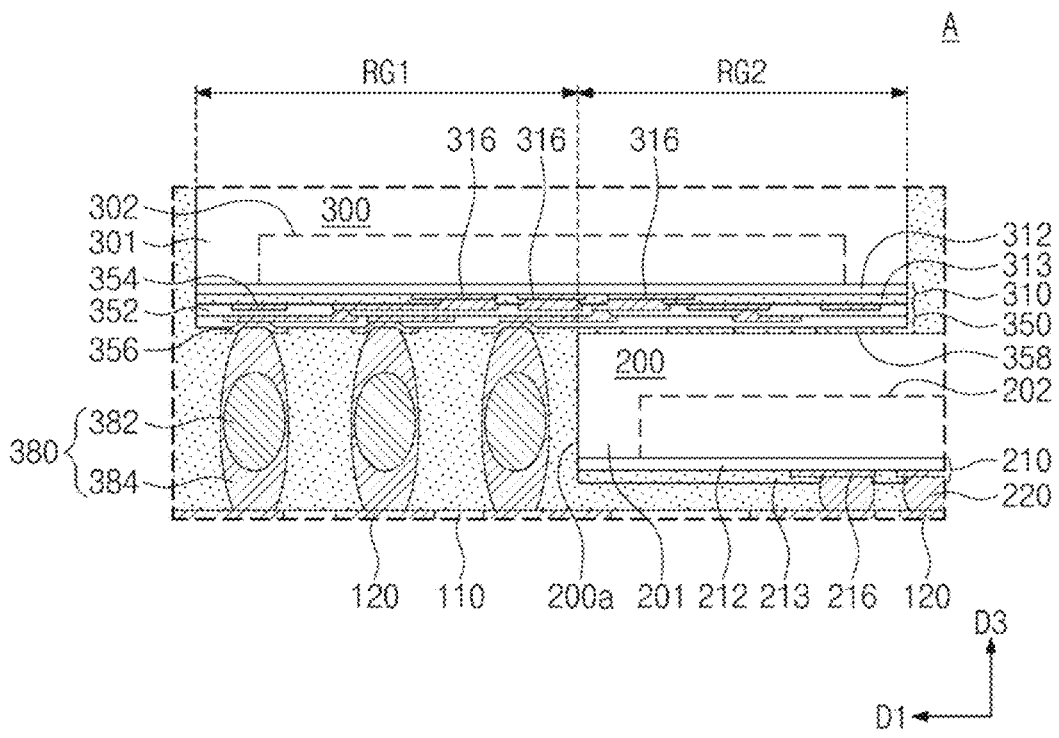
FIGS. 2 and 3 illustrate enlarged cross-sectional views showing section A of FIG. 1.
Figure 3:
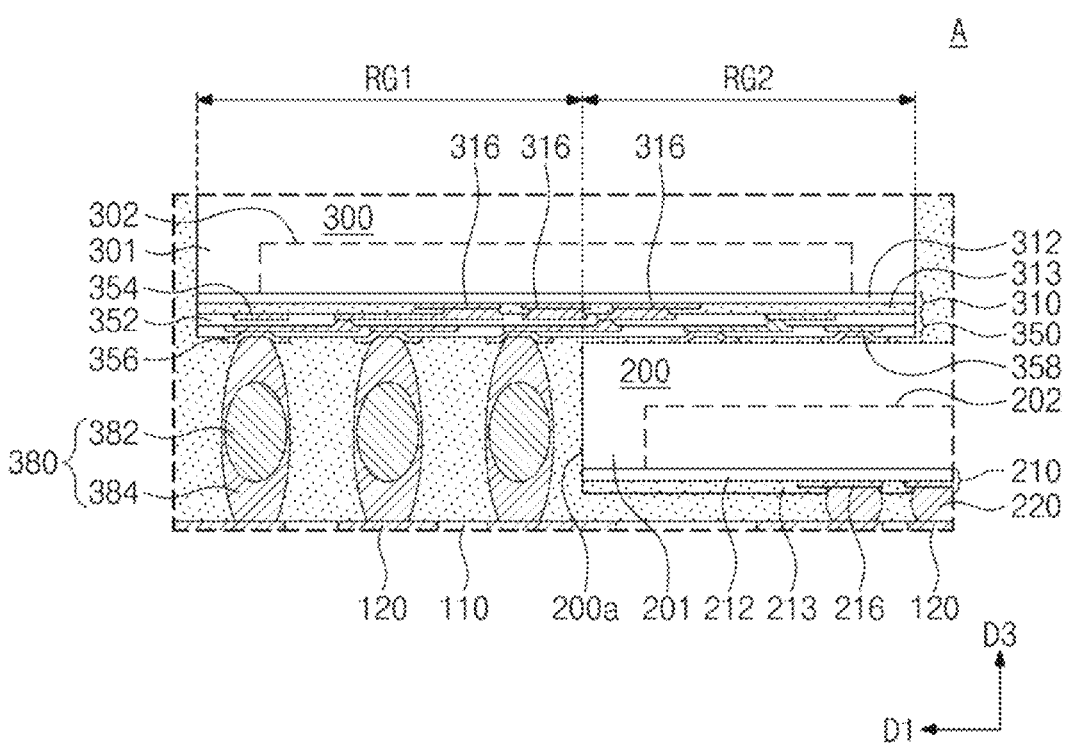
Figure 4:
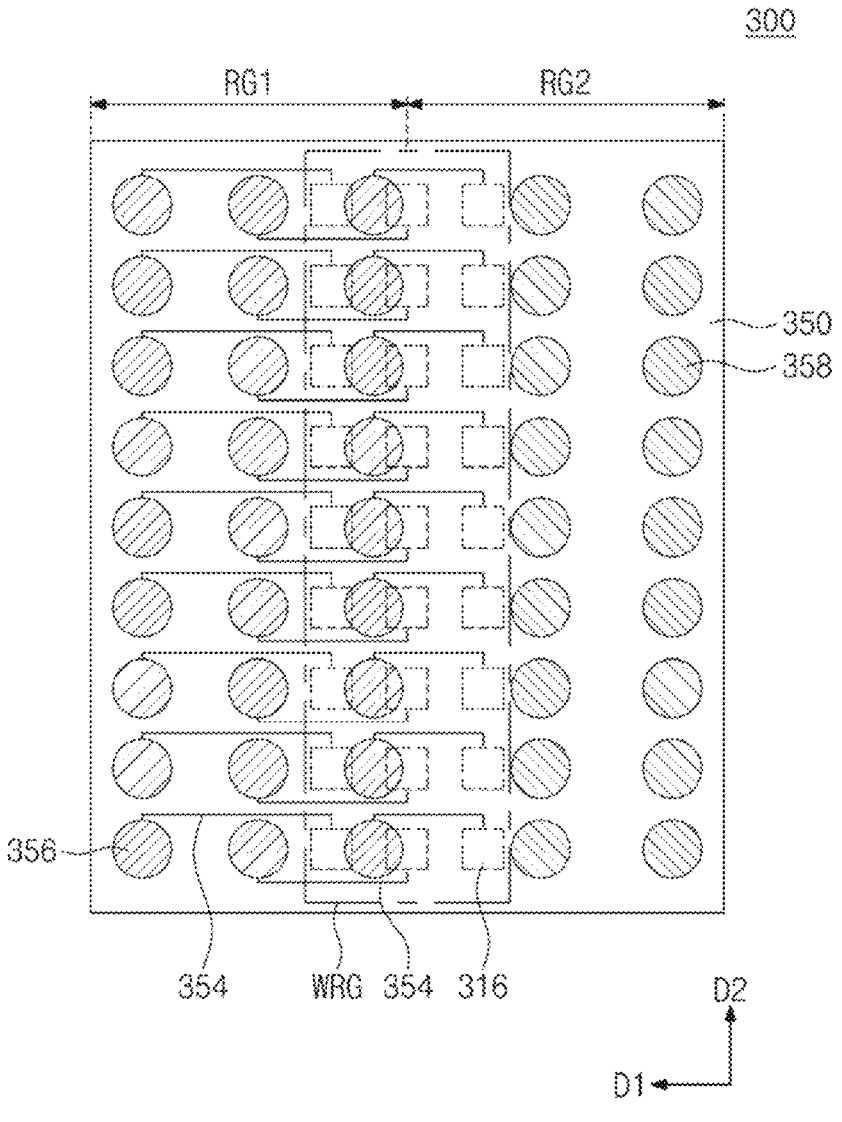
FIG. 4 illustrates a plan view showing redistribution by a redistribution layer of a second semiconductor chip.
Figure 5:
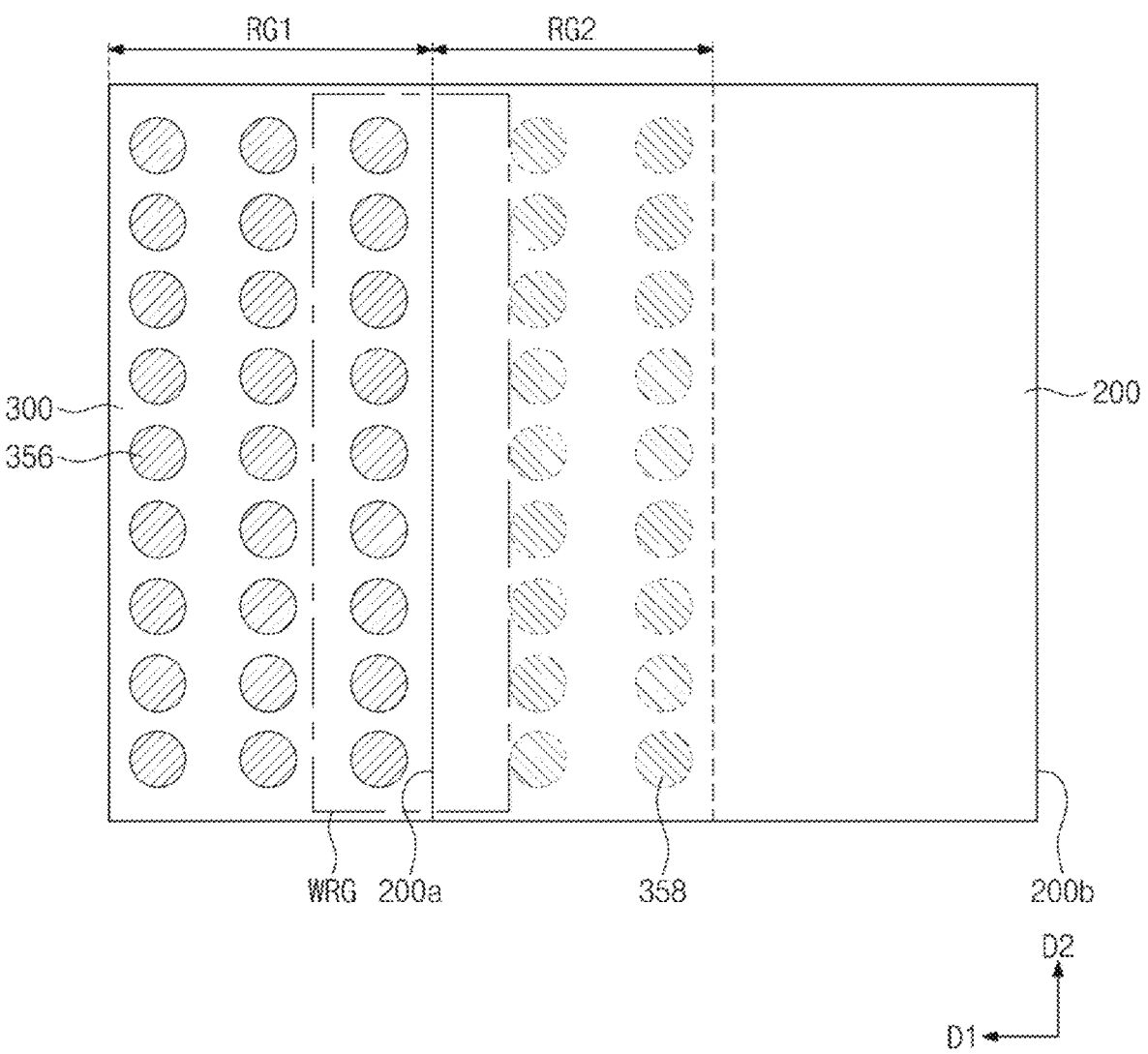
FIG. 5 illustrates a plan view showing an arrangement of a first semiconductor chip and a second semiconductor chip.

FIG. 1 illustrates a cross-sectional view showing a semiconductor package according to some example embodiments of the present inventive concepts. FIGS. 2 and 3 illustrate enlarged cross-sectional views showing section A of FIG. 1. FIG. 4 illustrates a plan view showing redistribution by a redistribution layer of a second semiconductor chip. FIG. 5 illustrates a plan view showing an arrangement of a first semiconductor chip and a second semiconductor chip.

Referring to FIGS. 1 and 2, a package substrate 100 may be provided. The package substrate 100 may be a redistribution substrate. For example, the package substrate 100 may include one or more substrate wiring layers that are stacked on each other. Each of the substrate wiring layers may include a substrate dielectric layer 110 and a substrate wiring pattern 120 in the substrate dielectric layer 110. The substrate wiring pattern 120 of one of the substrate wiring layers may be electrically connected to the substrate wiring pattern 120 of a neighboring substrate wiring layer.

The substrate dielectric layer 110 may include a dielectric polymer or a photo-imageable dielectric (PID) polymer. For example, the photo-imageable dielectric polymer may include one or more of photosensitive polyimide, polybenzoxazole (PBO), phenolic polymers, and benzocyclobutene polymers.

The substrate wiring pattern 120 may be provided in the substrate dielectric layer 110. The substrate wiring pattern 120 may horizontally extend in the substrate dielectric layer 110. For example, the substrate wiring pattern 120 may be one of a pad part and a line part of the substrate wiring layer. In such cases, the substrate wiring pattern 120 may be a component for horizontal redistribution in the package substrate 100. The substrate wiring pattern 120 may be provided on an upper portion of the substrate dielectric layer 110. The substrate wiring pattern 120 may have a top surface that is exposed on a top surface of the substrate dielectric layer 110. The substrate wiring pattern 120 provided at an uppermost substrate wiring layer may serve as a substrate pad coupled to one of a first semiconductor chip 200 and a first connection terminal 380 which will be discussed below. The substrate wiring pattern 120 may include a conductive material. For example, the substrate wiring pattern 120 may include metal, such as copper (Cu).

The substrate wiring pattern 120 may have a via that protrudes onto a bottom surface thereof. The via may be a component for vertical connection between the substrate wiring patterns 120 of neighboring substrate wiring layers. In some example embodiments, the via may be a component for connection between an external pad 130 and the substrate wiring pattern 120 of a lowermost substrate wiring layer. For example, the via may be coupled from the bottom surface of the substrate wiring pattern 120 to the top surface of the substrate wiring pattern 120 of an underlying another substrate wiring layer. In some example embodiments, the via may be coupled form the bottom surface of the substrate wiring pattern 120 through a lowermost substrate dielectric layer 110 to a top surface of the external pad 130.

A plurality of external pads 130 may be provided on a bottom surface of the lowermost substrate wiring layer. The external pads 130 may be electrically connected to the substrate wiring pattern 120. The external pads 130 may serve as pads to which are coupled a plurality of external terminals 150 which will be discussed below.

A substrate protection layer 140 may be provided. The substrate protection layer 140 may cover the bottom surface of the lowermost substrate wiring layer and expose the external pads 130. The external pads 130 may be provided with external terminals 150 on exposed bottom surfaces thereof. The external terminals 150 may include a solder ball or a solder bump.

The package substrate 100 may be configured as discussed above. The present inventive concepts, however, are not limited thereto. The package substrate 100 may be a printed circuit board (PCB). For example, the package substrate 100 may have a core portion layer and peripheral parts for connection between lines on top and bottom portions of the core portion layer.

A first semiconductor chip 200 may be disposed on the package substrate 100. The first semiconductor chip 200 may have a front surface and a rear surface. In this description below, a front surface may be defined to refer to a surface at an active surface side on which is formed an integrated element of a semiconductor chip, and a rear surface may be defined to refer to another surface opposite to the front surface. For example, the first semiconductor chip 200 may include first chip pads 216 provided on the front surface of the first semiconductor chip 200. The first semiconductor chip 200 may have a first lateral surface 200a and a second lateral surface 200b that are opposite to each other in a first direction D1. Hereinafter, a first direction D1 and a second direction D2 are defined to each indicate a direction parallel to a top surface of the package substrate 100, and a third direction D3 is defined to indicate a direction perpendicular to the top surface of the package substrate 100. The first lateral surface 200a may be a lateral surface in the first direction D1 of the first semiconductor chip 200, and the second lateral surface 200b may be a lateral surface of the first semiconductor chip 200 in a direction reverse to the first direction D1. The first semiconductor chip 200 may be a memory chip, such as dynamic random-access memory (DRAM), static random access memory (SRAM), magnetic random access memory (MRAM), or Flash memory. In some example embodiments, the first semiconductor chip 200 may be a logic chip, a passive device, or any other suitable semiconductor chip. The first semiconductor chip 200 may include a semiconductor material, such as silicon (Si).

The first semiconductor chip 200 may have a first base layer 201 on which is formed a first integrated circuit 202 of the first semiconductor chip 200, and may also have a first chip wiring layer 210 provided on one surface on which the first integrated circuit 202 is formed on the first base layer 201. The first chip wiring layer 210 may include a first chip dielectric pattern 212, a first chip wiring pattern 214 in the first chip dielectric pattern 212, first chip pads 216 connected to the first chip wiring pattern 214, and a first chip passivation layer 213 that encapsulates the first chip wiring pattern 214 on the first chip dielectric pattern 212 and exposes the first chip pads 216.

The first chip dielectric pattern 212 may be disposed on a bottom surface of the first base layer 201, covering the first integrated circuit 202. The first chip dielectric pattern 212 may be provided in plural (e.g., the semiconductor package may include a plurality of first chip dielectric patterns 212), and the plurality of first chip dielectric patterns 212 may be stacked on each other. In this case, the first chip dielectric patterns 212 may be wiring layers that are vertically connected to each other. The first chip dielectric patterns 212 may include silicon oxide (SiO), silicon nitride (SiN), or silicon oxynitride (SiON).

The first chip pads 216 may be provided on a bottom surface of the first chip dielectric pattern 212. The first chip pads 216 may be provided on a central portion of the first semiconductor chip 200. For example, the first chip pads 216 may be arranged in the second direction D2 on the central portion of the first semiconductor chip 200. The first chip pads 216 may be arranged to constitute one column or two or more plurality of columns. In addition, the first chip pads 216 may be arranged in a honeycomb shape or a grid shape having a plurality of columns and rows along the first and second directions D1 and D2. In some example embodiments, the first chip pads 216 may be arranged at an irregular period. For example, the first chip pads 216 may be provided to have no specific regularity. In this case, the first chip pads 216 may be variously arranged depending on integration and/or positions of wiring lines in the first semiconductor chip 200. The first chip pads 216 may include a metallic material, such as aluminum (Al).

The first chip wiring pattern 214 may be provided in the first chip dielectric pattern 212. The first chip wiring pattern 214 may horizontally extend in the first chip dielectric pattern 212. For example, the first chip dielectric pattern 212 may be a component for horizontal redistribution of the first integrated circuit 202 in the first semiconductor chip 200. The first chip dielectric pattern 212 may connect the first integrated circuit 202 to the first chip pads 216. FIG. 1 depicts that the first chip wiring pattern 214 is illustrated as an arbitrary solid line to indicate connections between the first integrated circuit 202 and the first chip pads 216, but in the present inventive concepts, a shape or electrical connection of the first chip wiring pattern 214 is not limited to that shown in FIG. 1.

The first chip passivation layer 213 may be provided on the bottom surface of the first chip dielectric pattern 212. The first chip passivation layer 213 may cover the first chip pads 216 on the bottom surface of the first chip dielectric pattern 212, and may have openings that expose portions of bottom surfaces of the first chip pads 216. The first chip passivation layer 213 may include a photosensitive polymer, such as polyimide.

The first semiconductor chip 200 may be flip-chip mounted on the package substrate 100. For example, the first semiconductor chip 200 may be placed to allow the first chip pads 216 to face the package substrate 100. In this case, the first semiconductor chip 200 may be placed to allow its front surface to face the package substrate 100. A plurality of first chip terminals 220 may be provided between the package substrate 100 and the first chip pads 216. The first chip terminals 220 may penetrate the first chip passivation layer 213 and may be coupled to the first chip pads 216. For example, in the openings of the first chip passivation layer 213, the first chip terminals 220 may be coupled to the first chip pads 216. The first semiconductor chip 200 may be connected to the package substrate 100 through the first chip pads 216, the first chip terminals 220, and the substrate wiring pattern 120. The first chip terminals 220 may include a solder ball or a solder bump.

A second semiconductor chip 300 may be disposed on the first semiconductor chip 200. The second semiconductor chip 300 may be disposed on the rear surface of the first semiconductor chip 200. The second semiconductor chip 300 and the first semiconductor chip 200 may be disposed in an offset stack structure. For example, the first semiconductor chip 200 and the second semiconductor chip 300 may be stacked obliquely in the first direction D1, which may result in an ascending stepwise shape. For example, a portion of the second semiconductor chip 300 may overlap the first semiconductor chip 200, and another portion of the second semiconductor chip 300 may protrude onto a certain lateral surface of the first semiconductor chip 200. The second semiconductor chip 300 may protrude onto the first lateral surface 200a of the first semiconductor chip 200. For example, when viewed in a plan view, the second semiconductor chip 300 may be stacked on the first semiconductor chip 200 such that the second semiconductor chip 300 may be shifted in the first direction D1 from the first semiconductor chip 200 (e.g., the second semiconductor chip 300 may be offset from the first semiconductor chip 200 in a horizontal direction that is parallel to at least a top surface of the package substrate 100, or the like, such as the first direction D1), such that the second semiconductor chip 300 may vertically overlap (e.g., overlap in the third direction D3) the first lateral surfaces 200a of the first semiconductor chip 200 and may not vertically overlap the second lateral surface 200b of the first semiconductor chip 200. A front surface, or a bottom surface, of the second semiconductor chip 300 may be parallel or substantially parallel to the top surface of the package substrate 100.

The second semiconductor chip 300 may be configured identical or substantially identical or similar to the first semiconductor chip 200. For example, the second semiconductor chip 300 may be of the same type as the first semiconductor chip 200. For example, the second semiconductor chip 300 may be a memory chip, such as dynamic random-access memory (DRAM), static random access memory (SRAM), magnetic random access memory (MRAM), or Flash memory. In some example embodiments, the second semiconductor chip 300 may be a logic chip, a passive device, or any other suitable semiconductor chip. The second semiconductor chip 300 may include a semiconductor material, such as silicon (Si). The second semiconductor chip 300 may include a second base layer 301 in which is formed a second integrated circuit 302 of the second semiconductor chip 300, and may also include a second chip wiring layer 310 provided on one surface on which the second integrated circuit 302 is formed in the second base layer 301. The second chip wiring layer 310 may include a second chip dielectric pattern 312, a second chip wiring pattern 314 in the second chip dielectric pattern 312, second chip pads 316 connected to the second chip wiring pattern 314, and a second chip passivation layer 313 that covers the second chip wiring pattern 314 on the second chip dielectric pattern 312 and exposes the second chip pads 316.

On a bottom surface of the second base layer 301, the second chip dielectric pattern 312 may cover the second integrated circuit 302. The second chip dielectric pattern 312 may be provided in plural (e.g., the semiconductor package may include a plurality of second chip dielectric patterns 312), and the plurality of second chip dielectric patterns 312 may be stacked on each other. In this case, the second chip dielectric patterns 312 may be wiring layers that are vertically connected to each other. The second chip dielectric patterns 312 may include silicon oxide (SiO), silicon nitride (SiN), or silicon oxynitride (SiON).

The second chip pads 316 may be provided on a bottom surface of the second chip dielectric pattern 312. The second chip pads 316 may be provided on a central portion of the second semiconductor chip 300. For example, as shown in FIG. 4, the second chip pads 316 may be arranged in the second direction D2 on the central portion of the second semiconductor chip 300. FIG. 4 depicts that the second chip pads 316 constitute three columns along the second direction D2, but the present inventive concepts are not limited thereto. The second chip pads 316 may be arranged to constitute one column, two columns, or four or more columns. In addition, the second chip pads 316 may be arranged in a honeycomb shape or a grid shape having a plurality of columns and rows along the first and second directions D1 and D2. In some example embodiments, the second chip pads 316 may be arranged at an irregular period. For example, the second chip pads 316 may be provided to have no specific regularity. In this case, the second chip pads 316 may be various arranged depending on integration and/or positions of lines in the second semiconductor chip 300. The second chip pads 316 may include a metallic material, such as aluminum (Al).

The second chip wiring pattern 314 may be provided in the second chip dielectric pattern 312. The second chip wiring pattern 314 may horizontally extend in the second chip dielectric pattern 312. For example, the second chip dielectric pattern 312 may be a component for horizontal redistribution of the second integrated circuit 302 in the second semiconductor chip 300. The second chip dielectric pattern 312 may connect the second integrated circuit 302 to the second chip pads 316. FIG. 1 depicts that the second chip wiring pattern 314 is illustrated as an arbitrary solid line to indicate connections between the second integrated circuit 302 and the second chip pads 316, but in the present inventive concepts, a shape or electrical connection of the second chip wiring pattern 314 is not limited to that shown in FIG. 1.

The second chip passivation layer 313 may be provided on the bottom surface of the second chip dielectric pattern 312. The second chip passivation layer 313 may cover the second chip pads 316 on the bottom surface of the second chip dielectric pattern 312, and may have openings that expose portions of bottom surfaces of the second chip pads 316. The second chip passivation layer 313 may include a photosensitive polymer, such as polyimide.

The second semiconductor chip 300 may be disposed to allow the second chip pads 316 to face the package substrate 100. In this case, the second semiconductor chip 300 may be placed to allow its front surface to face the package substrate 100. The second semiconductor chip 300 may be a memory chip. In some example embodiments, the second semiconductor chip 300 may be a logic chip, a passive device, or any other suitable semiconductor chip. The second semiconductor chip 300 may include a semiconductor material, such as silicon (Si). The second semiconductor chip 300 may have a thickness the same as that of the first semiconductor chip 200. For example, a distance between a top surface of the second base layer 301 and bottom surfaces of the second chip pads 316 may be the same as a distance between a top surface of the first base layer 201 and bottom surfaces of the first chip pads 216.

The second semiconductor chip 300 may further include a first redistribution layer 350 provided on the front surface of the second semiconductor chip 300. For example, the first redistribution layer 350 may be provided on the bottom surface of the second semiconductor chip 300, and may cover the second base layer 301 and the second chip wiring layer 310. The first redistribution layer 350 may include a first dielectric pattern 352 stacked on the bottom surface of the second semiconductor chip 300, a first wiring pattern 354 provided in the first dielectric pattern 352, and first signal pads 356 and first dummy pads 358 exposed on a bottom surface of the first redistribution layer 350.

The first dielectric pattern 352 may cover a bottom surface of the second chip wiring layer 310. The first dielectric pattern 352 may include a plurality of dielectric layers that are stacked on each other. The first dielectric pattern 352 may include a dielectric material. For example, the first dielectric pattern 352 may include a dielectric polymer. The first dielectric pattern 352 may include at least one selected from photosensitive polyimide, polybenzoxazole (PBO), phenolic polymers, and benzocyclobutene polymers.

The first signal pads 356 and the first dummy pads 358 may be provided below the first dielectric pattern 352. The first signal pads 356 and the first dummy pads 358 may be exposed on a bottom surface of the first dielectric pattern 352. In this case, the first signal pads 356 and the first dummy pads 358 may extend or protrude onto the bottom surface of the first dielectric pattern 352. For example, each of the first signal pads 356 and the first dummy pads 358 may have a portion that is positioned on the bottom surface of the first dielectric pattern 352, and may also have another portion that penetrates the first dielectric pattern 352 and are connected to the first wiring pattern 354 in the first dielectric pattern 352. In some example embodiments, the first signal pads 356 and the first dummy pads 358 may have their bottom surfaces coplanar with the bottom surface of the first dielectric pattern 352. The bottom surfaces of the first signal pads 356 and of the first dummy pads 358 may be located at the same level as that of the top surface of the package substrate 100. The first signal pads 356 and the first dummy pads 358 may be under-bump pads that are exposed on a lowermost surface of the first redistribution layer 350. The first signal pads 356 may be connection pads for externally transceiving electrical signals with the second integrated circuit 302 of the second semiconductor chip 300, and the first dummy pads 358 may be electrically floated from the second integrated circuit 302 of the second semiconductor chip 300. The first signal pads 356 and the first dummy pads 358 may include a conductive material. For example, the first signal pads 356 and the first dummy pads 358 may include copper (Cu).

In the present specification, the term 'level' may mean a vertical height and/or a distance from a reference location (e.g., the bottom surface of the first semiconductor chip 200, the bottom surface of the second semiconductor chip 300, the top surface of the package substrate 100, or the like) in a vertical direction (e.g., the third direction D3). A reference location may be understood to be a location that a level and/or relative level of an element is "based on" or is a level "from." For example, when a first element is described herein to be at a level from a reference location that is higher than a second element, the first element may be further from the reference location in the vertical direction (e.g., third direction D3) than the second element. In another example, when a first element is described herein to be at a level from a reference location that is lower than a second element, the first element may be closer to reference location in the vertical direction (e.g., third direction D3) than the second element. In another example, when a first element is described herein to be at a same or substantially same level from a reference location as a second element, the first element may be equally distant from/close to the reference location in the vertical direction (e.g., third direction D3) as the second element.

FIG. 4 depicts the bottom surface of the second semiconductor chip 300, and for convenience of description, FIG. 4 also depicts positions of the second chip pads 316 in the second semiconductor chip 300.

Referring to FIGS. 1 to 4, the second semiconductor chip 300 may have a first region RG1 and a second region RG2. The first region RG1 may be positioned in the first direction D1 of the second region RG2. When viewed in a plan view, the first region RG1 of the second semiconductor chip 300 may be positioned on one side in the first direction D1 of the first semiconductor chip 200, and the second region RG2 of the second semiconductor chip 300 may be positioned on the first semiconductor chip 200. The first region RG1 of the second semiconductor chip 300 may be defined to refer to an area where the first signal pads 356 are provided, and the second region RG2 of the second semiconductor chip 300 may be defined to refer to an area where the first dummy pads 358 are provided.

The first signal pads 356 may be disposed on the first region RG1 on the front surface of the second semiconductor chip 300. The first signal pads 356 may constitute at least one column that extends along the first lateral surface 200a of the first semiconductor chip 200 on the first region RG1. For example, the first signal pads 356 may constitute at least one column that extends along the second direction D2 on the first region RG1. When viewed in a plan view, each of the first signal pads 356 may be spaced apart from (e.g., isolated from direct contact with) the first semiconductor chip 200. FIG. 4 depicts that the first signal pads 356 constitute three columns, but the present inventive concepts are not limited thereto. The first signal pads 356 may constitute one column, two columns, or four or more plurality of columns. A plurality of columns constituted by the first signal pads 356 may be spaced apart from each other in the first direction D1.

The first dummy pads 358 may be disposed on the front surface of the second semiconductor chip 300 on the second region RG2. The first dummy pads 358 may constitute at least one column that extends along the second direction D2 on the second region RG2. Each of the first dummy pads 358 may vertically overlap the first semiconductor chip 200 (e.g., overlap the first semiconductor chip 200 in the third direction D3). FIG. 4 depicts that the first dummy pads 358 constitute two columns, but the present inventive concepts are not limited thereto. The first dummy pads 358 may constitute one column or three or more plurality of columns. A plurality of columns that are constituted by the first dummy pads 358 may be spaced apart from each other in the first direction D1. FIG. 4 depicts that the first dummy pads 358 are arranged along the second direction D2, but the present inventive concepts are not limited thereto. An arrangement of the first dummy pads 358 may be variously changed based on positions and weights of the first semiconductor chip 200 and the second semiconductor chip 300.

The first wiring pattern 354 may be provided within the first dielectric pattern 352. The first wiring pattern 354 may be coupled to the second chip pads 316 after penetrating the second chip passivation layer 313 of the second chip wiring layer 310, and may electrically connect the second chip pads 316 to the first signal pads 356 The second chip wiring layer 310 and the first wiring pattern 354 may cause the second integrated circuit 302 of the second semiconductor chip 300 to have electrical connection with the first signal pads 356. For example, as shown in FIG. 4, the first redistribution layer 350 may have a window region WRG positioned on a top surface thereof. The window region WRG may extend in the second direction D2 on a central portion of the first redistribution layer 350. When viewed in a plan view, the window region WRG may be the same as an area where the second chip pads 316 are disposed, and the area may be defined to indicate a section where the first wiring pattern 354 and the second chip pads 316 are coupled at an interface between the first redistribution layer 350 and the second chip wiring layer 310. For example, on the window region WRG, the first wiring pattern 354 may be exposed on a top surface of the first dielectric pattern 352 or the top surface of the first redistribution layer 350, and the exposed first wiring pattern 354 may be in contact (e.g., in direct contact) with the second chip pads 316. The first signal pads 356 may be arranged in the second direction D2 on one side in the first direction D1 of the window region WRG. In this case, ones of the first signal pads 356 may overlap the window region WRG. FIG. 4 depicts that a boundary between the first and second regions RG1 and RG2 overlaps the window region WRG, but the present inventive concepts are not limited thereto. In addition, FIG. 4 depicts that the first wiring pattern 354 is illustrated as an arbitrary solid line to indicate connections between the first signal pads 356 and the second chip pads 316. As shown in FIG. 2, the first wiring pattern 354 may be electrically insulated from the first dummy pads 358. For example, the first dummy pads 358 may be positioned on the bottom surface of the first dielectric pattern 352, and the first dielectric pattern 352 may separate the first dummy pads 358 from the first wiring pattern 354. The second integrated circuit 302 of the second semiconductor chip 300 may be electrically insulated from the first dummy pads 358. Accordingly, the first dummy pads 358 may be insulated from the second integrated circuit 302 of the second semiconductor chip 300, for example by at least the first dielectric pattern 352. In some example embodiments, as shown in FIG. 3, portions of the first wiring pattern 354 may be connected to the first dummy pads 358. In this case, the portions of the first wiring pattern 354 connected to the first dummy pads 358 may be electrically floated from second chip pads 316. Therefore, the second integrated circuit 302 of the second semiconductor chip 300 may be electrically insulated from the first dummy pads 358 based on the electric floating.

FIG. 5 roughly illustrates the bottom surface of the second semiconductor chip 300, and for convenience of description, FIG. 5 also depicts a position of the first semiconductor chip 200. In FIG. 5, the second semiconductor chip 300 is seen from the bottom, and the first semiconductor chip 200 covers a portion of the bottom surface of the second semiconductor chip 300.

Referring to FIGS. 1 to 5, the second semiconductor chip 300 may be flip-chip mounted on the package substrate 100. For example, first connection terminals 380 (also referred to herein as first solders) may be provided between the first signal pads 356 (which may be referred to as a plurality of first pads of under-bump pads on a bottom surface of the first redistribution layer 350) and the package substrate 100 (e.g., substrate wiring pattern 120 which may include a plurality of substrate pads of the package substrate 100). The first dummy pads 358 may be referred to as a plurality of second pads of the under-bump pads that are in direct contact with a top surface of the first semiconductor chip 200. The first signal pads 356 may be connected through the first redistribution layer 350 to an integrated circuit of the second semiconductor chip 300. The second semiconductor chip 300 may be connected to the package substrate 100 through the first signal pads 356, the first connection terminals 380, and the substrate wiring pattern 120. The first connection terminals 380 may be disposed on one side in the first direction D1 of the first semiconductor chip 200 (e.g., adjacent to the first semiconductor chip 200). For example, the first connection terminals 380 may be disposed adjacent to the first lateral surface 200a of the first semiconductor chip 200. The first connection terminals 380 may be correspondingly provided on the first signal pads 356. An arrangement of the first connection terminals 380 may conform to that of the first signal pads 356. For example, the first connection terminals 380 may constitute at least one column that extends along the second direction D2. The first connection terminals 380 may be coupled to the substrate wiring pattern 120 of the package substrate 100. Therefore, the second integrated circuit 302 of the second semiconductor chip 300 may be electrically connected to the package substrate 100 through the first redistribution layer 350, the first signal pads 356, and the first connection terminals 380. The first connection terminals 380 may have their top surfaces located at a level from the package substrate 100 the same as that of a top surface of the first semiconductor chip 200. In some example embodiments, the top surfaces of the first connection terminals 380 may be located at a level from the package substrate 100 different from that of the top surface of the first semiconductor chip 200. The first connection terminals 380 may have a first height that is about 1.5 times to about 30 times a second height of the first chip terminals 220. For example, the first height of the first connection terminals 380 may range from about 50 μm to about 300 μm, and the second height of the first chip terminals 220 may range from about 10 μm to about 50 μm. The first connection terminals 380 may include a solder ball or a solder bump. For example, the first connection terminals 380 may be solder balls each having a composite structure that includes a core portion 382 (e.g., solder core portion) formed of metal and a peripheral portion 384 (e.g., solder peripheral portion) surrounding the core portion 382. According to some example embodiments, the first connection terminals 380 may include one of a conductive post, a vertical via, and any other suitable connection terminal each of which is coupled to the substrate wiring pattern 120 of the package substrate 100.

The first dummy pads 358 of the second semiconductor chip 300 may be in contact (e.g., in direct contact) with the top surface of the first semiconductor chip 200. For example, the first dummy pads 358 may be provided between the bottom surface of the second semiconductor chip 300 and the top surface of the first semiconductor chip 200. On the top surface of the first semiconductor chip 200, the first dummy pads 358 may support the second semiconductor chip 300. The first dummy pads 358 may be in direct contact with the top surface of the first semiconductor chip 200 or the top surface of the first base layer 201.

According to some example embodiments of the present inventive concepts, as the first and second semiconductor chips 200 and 300 are disposed to vertically overlap each other, the first and second semiconductor chips 200 and 300 may have a reduced occupying planar area and a compact-sized semiconductor package may be provided. The first redistribution layer 350 may redistribute the second semiconductor chip 300 to allow the first signal pads 356 to line on one side of the second semiconductor chip 300. Therefore, a semiconductor package may be formed to have a large overlapping area between the second semiconductor chip 300 and the first semiconductor chip 200, and may decrease in planar area. For example, even when the first semiconductor chip 200 is provided thereon with the window region WRG on which are provided the second chip pads 316 of the second semiconductor chip 300, the first redistribution layer 350 may cause an electrical connection of the second semiconductor chip 300 to extend toward one side of the first semiconductor chip 200 and may easily mount the second semiconductor chip 300 on the package substrate 100. Therefore, a semiconductor package may become small in size.

In addition, as the second semiconductor chip 300 is redistributed by the first redistribution layer 350, it may be possible to increase the degree of freedom of electrical connection for the second semiconductor chip 300. Moreover, the second semiconductor chip 300 may be directly connected to the package substrate 100, and thus there may be a reduced length of electrical connection between the second semiconductor chip 300 and the package substrate 100. Accordingly, a semiconductor package may increase in electrical properties.

Furthermore, the first dummy pads 358 may be used to support the second semiconductor chip 300 on the first semiconductor chip 200 (e.g., such that the second semiconductor chip 300 may be supported on a top surface of the first semiconductor chip 200 such that at least a portion of the structural load or weight of the second semiconductor chip 300 is configured to be transferred to at least the first semiconductor chip 200 via at least the top surface of the first semiconductor chip 200), and thus a semiconductor package may be provided to have improved structural stability. The first dummy pads 358 may be disposed regardless of wiring connection of the first semiconductor chip 200 and/or regardless of wiring connection of the second semiconductor chip 300, and an arrangement of the first dummy pads 358 may be variously changed based on shape and thickness of the second semiconductor chip 300. Accordingly, the second semiconductor chip 300 may be stably supported on the first semiconductor chip 200, and a semiconductor package may be provided to have improved structural stability.

Referring back to FIGS. 1 to 3, a molding layer 400 may be provided on the package substrate 100. The molding layer 400 may cover the package substrate 100. On the package substrate 100, the molding layer 400 may encapsulate the first connection terminals 380, the first semiconductor chip 200, and the second semiconductor chip 300. For example, the molding layer 400 may cover lateral and top surfaces of the first semiconductor chip 200 and lateral and top surfaces of the second semiconductor chip 300. Differently from that shown, the molding layer 400 may expose the top surface of the second semiconductor chip 300. On one side of the first semiconductor chip 200, the molding layer 400 may fill a space between the package substrate 100 and the second semiconductor chip 300. The molding layer 400 may surround the first connection terminals 380 between the package substrate 100 and the second semiconductor chip 300. The molding layer 400 may contact lateral surfaces of the first connection terminals 380. The molding layer 400 may extend into a gap between the first semiconductor chip 200 and the package substrate 100, thereby encapsulating the first chip terminals 220. The molding layer 400 may include a dielectric polymer, such as an epoxy molding compound (EMC).

Figure 6:
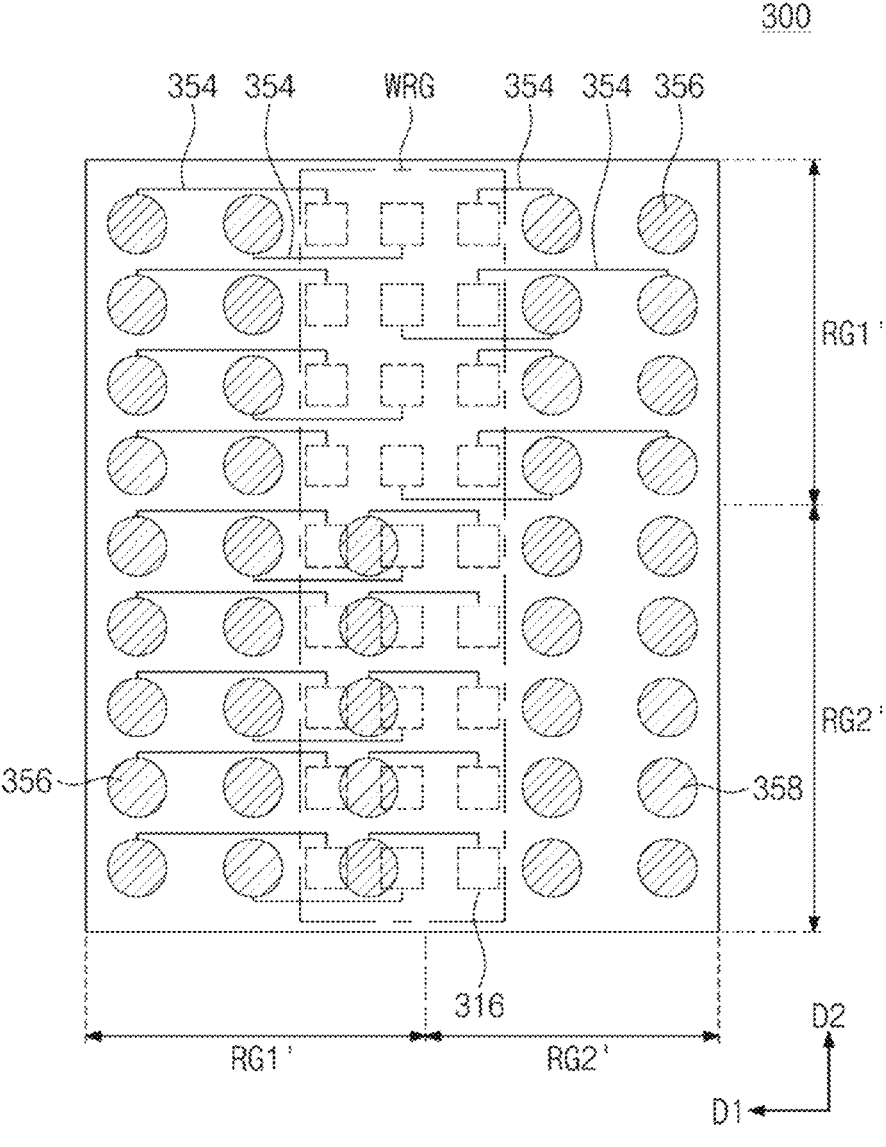
FIG. 6 illustrates a plan view showing redistribution by a redistribution layer of a second semiconductor chip.
Figure 7:
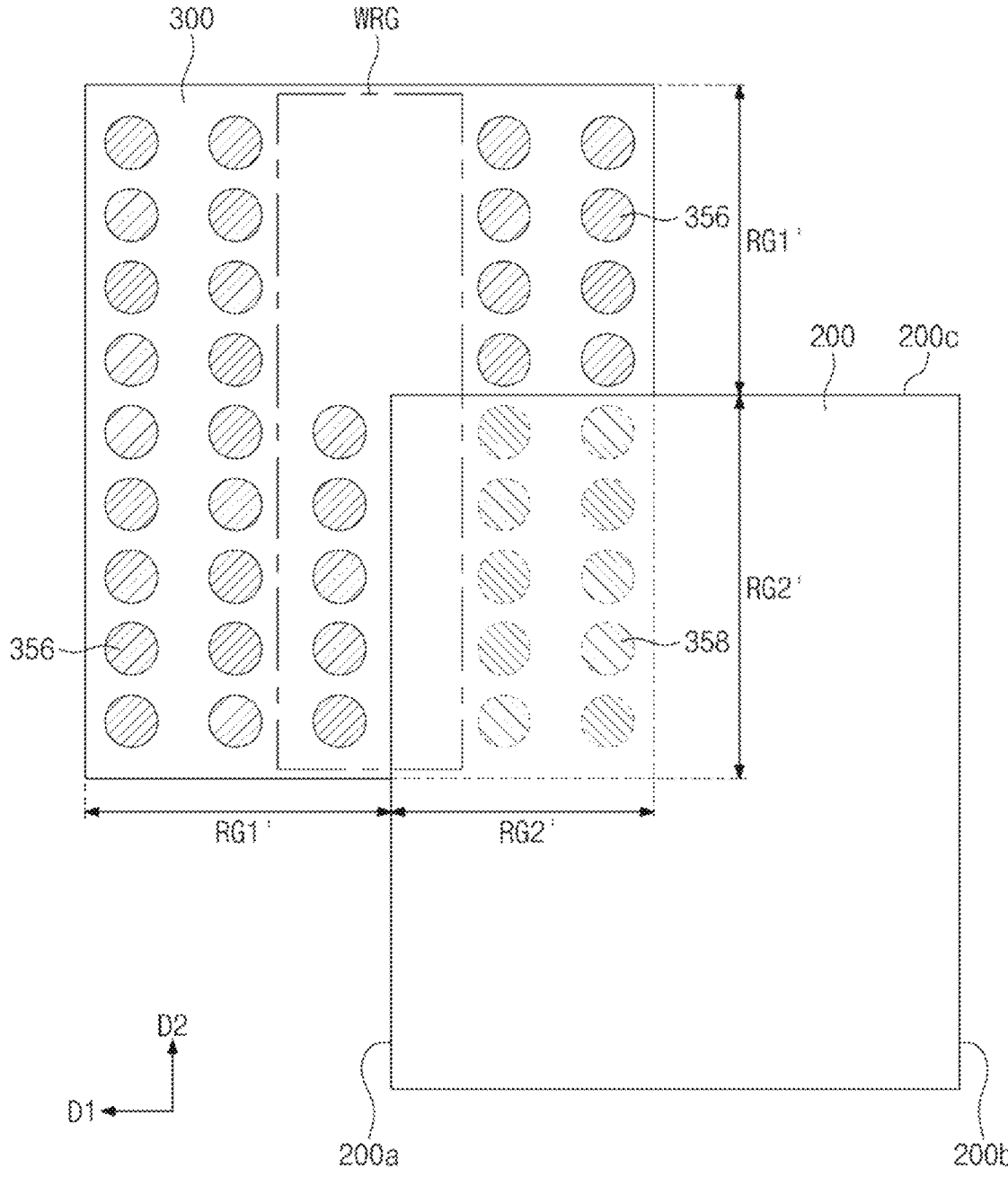
FIGS. 7, 8, and 9 illustrate plan views showing an arrangement of a first semiconductor chip and a second semiconductor chip.
Figure 8:
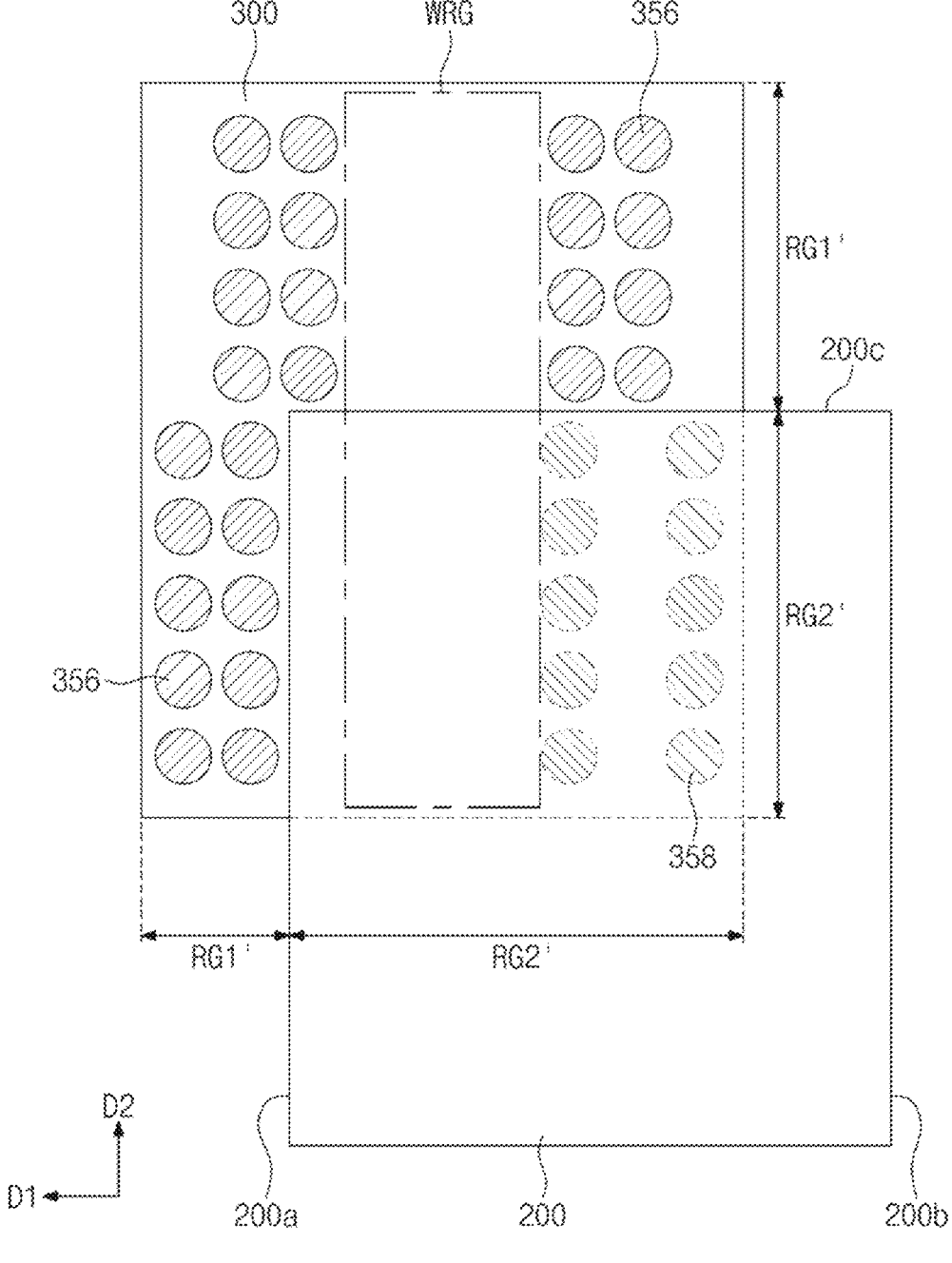
Figure 9:
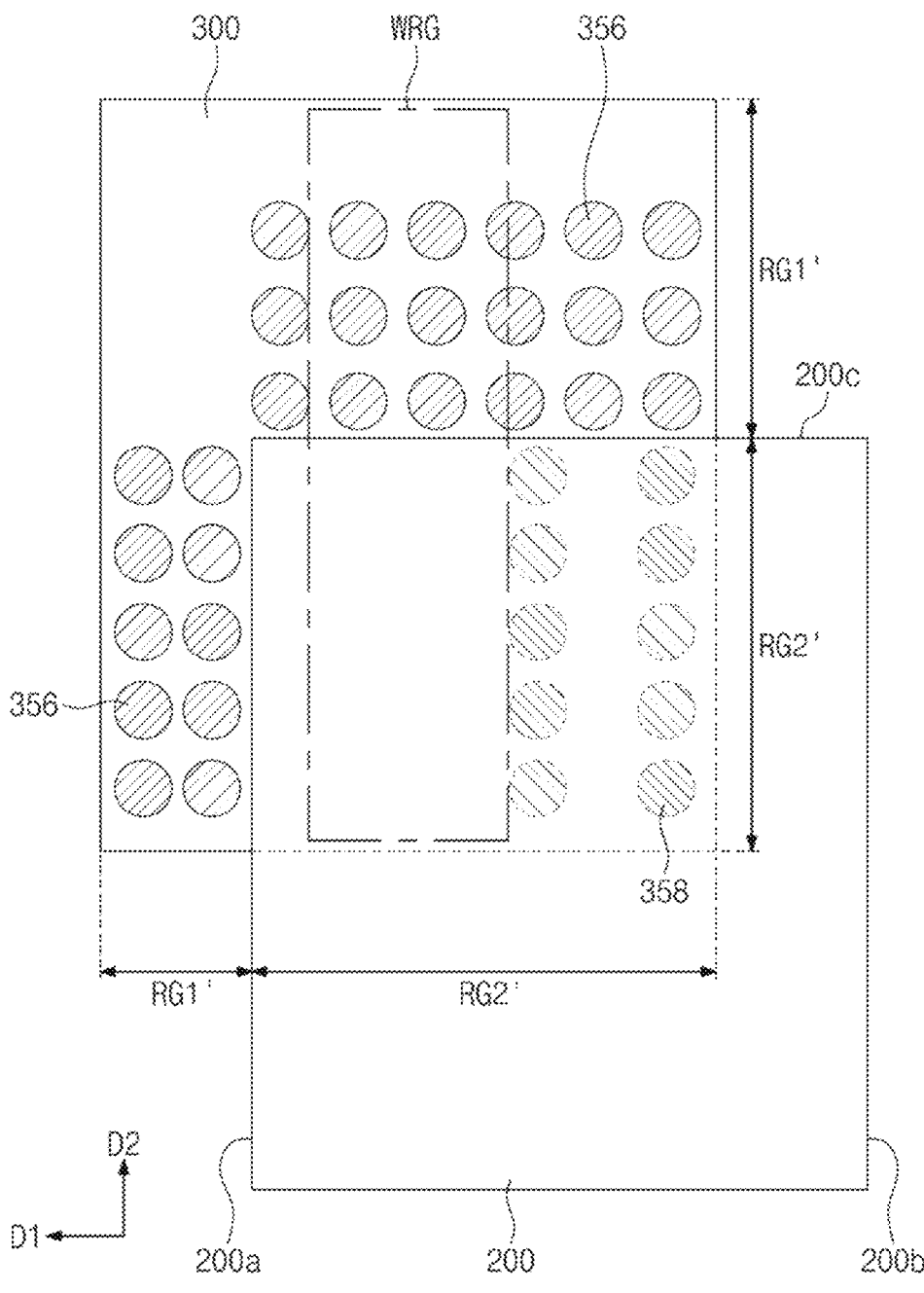

FIG. 6 illustrates a plan view showing redistribution by a redistribution layer of a second semiconductor chip. FIGS. 7, 8, and 9 illustrate plan views showing an arrangement of a first semiconductor chip and a second semiconductor chip. FIGS. 7 to 9 roughly illustrate the bottom surface of the second semiconductor chip 300, and for convenience of description, FIGS. 7 to 9 also depict a position of the first semiconductor chip 200. In FIGS. 7 to 9, the second semiconductor chip 300 is seen from the bottom, and the first semiconductor chip 200 covers a portion of the bottom surface of the second semiconductor chip 300.

Referring to FIGS. 1 to 3 and 6, the second semiconductor chip 300 may be disposed on the first semiconductor chip 200. The second semiconductor chip 300 may be positioned on the rear surface of the first semiconductor chip 200. The second semiconductor chip 300 and the first semiconductor chip 200 may be disposed in an offset stack structure. For example, the first semiconductor chip 200 and the second semiconductor chip 300 may be stacked obliquely in the first and second directions D1 and D2, which may result in an ascending stepwise shape. As shown in FIG. 7, the second semiconductor chip 300 may protrude beyond the first lateral surface 200a and a third lateral surface 200c of the first semiconductor chip 200. The third lateral surface 200c may be a lateral surface in the second direction D2 of the first semiconductor chip 200 and may be a lateral surface in contact (e.g., in direct contact) with the first lateral surface 200a and may be understood to be adjacent to the first lateral surface 200a. For example, when viewed in a plan view, the second semiconductor chip 300 may be stacked on the first semiconductor chip 200 such that the second semiconductor chip 300 may be shifted in the first and second directions D1 and D2 from the first semiconductor chip 200. The second semiconductor chip 300 may vertically overlap the first and third lateral surfaces 200a and 200c of the first semiconductor chip 200, such that the second semiconductor chip 300 may vertically overlap (e.g., overlap in the third direction D3) the adjacent first and third lateral surfaces 200a and 200c of the first semiconductor chip 200.

As illustrated in FIG. 7, the first lateral surface 200a of the first semiconductor chip 200 may be positioned below the window region WRG of the second semiconductor chip 300. According to some example embodiments, the first and second semiconductor chips 200 and 300 may be disposed to increase an overlapping area between the first and second semiconductor chips 200 and 300. For example, as shown in FIGS. 8 and 9, the first lateral surface 200a of the first semiconductor chip 200 may overlap the window region WRG of the second semiconductor chip 300, and when viewed in a plan view, may be positioned in the first direction D1 of the window region WRG.

The second semiconductor chip 300 may further include a first redistribution layer 350 provided on the front surface of the second semiconductor chip 300. The first redistribution layer 350 may include a first dielectric pattern 352 stacked on the bottom surface of the second semiconductor chip 300, a first wiring pattern 354 provided in the first dielectric pattern 352, and first signal pads 356 and first dummy pads 358 exposed on a bottom surface of the first redistribution layer 350.

The second semiconductor chip 300 may have a first region RG1' and a second region RG2'. The first region RG1' may be positioned I the first and second directions D1 and D2 of the second region RG2'. When viewed in a plan view, the first region RG1' of the second semiconductor chip 300 may be located on one side in the first direction D1 of the first semiconductor chip 200 and on one side in the second direction D2 of the first semiconductor chip 200, and the second region RG2' of the second semiconductor chip 300 may be located on the first semiconductor chip 200. For example, the first region RG1' may surround the second region RG2' in the first and second directions D1 and D2.

The first signal pads 356 may be disposed on the first region RG1' on the front surface of the second semiconductor chip 300. The first signal pads 356 may constitute at least one column that extends along the second direction D2 on the first region RG1'. For example, the first signal pads 356 adjacent to the first lateral surface 200a of the first semiconductor chip 200 may be arranged along the first lateral surface 200a of the first semiconductor chip 200 on one side in the first direction D1 of the window region WRG. When viewed in a plan view, the first signal pads 356 adjacent to the third lateral surface 200c of the first semiconductor chip 200 may be arranged in the second direction D2 on opposite sides in the first direction D1 of the window region WRG.

According to some example embodiments of the present inventive concepts, as the first signal pads 356 are disposed adjacent to the window region WRG on which the second chip pads 316 are disposed, a reduced length may be given to the first wiring pattern 354 that connects the first signal pads 356 to the second chip pads 316. As a result, a semiconductor package may have improved electrical properties.

The first dummy pads 358 may be disposed on the second region RG2' on the front surface of the second semiconductor chip 300. The first dummy pads 358 may constitute at least one column that extends along the second direction D2 on the second region RG2'. The first dummy pads 358 may constitute one column or three or more plurality of columns.

A plurality of columns that are constituted by the first dummy pads 358 may be spaced apart from each other in the first direction D1.

Referring to FIGS. 1 to 3, 6, and 7, the second semiconductor chip 300 may be flip-chip mounted on the package substrate 100. For example, first connection terminals 380 may be provided between the first signal pads 356 and the package substrate 100. The first connection terminals 380 may be disposed on one side in the first direction D1 of the first semiconductor chip 200 and on one side in the second direction D2 of the first semiconductor chip 200. For example, the first connection terminals 380 may be located adjacent to the first and third lateral surfaces 200a and 200c of the first semiconductor chip 200. The first connection terminals 380 may be correspondingly provided on the first signal pads 356. An arrangement of the first connection terminals 380 may conform to that of the first signal pads 356. The first connection terminals 380 may include a solder ball or a solder bump.

The first dummy pads 358 of the second semiconductor chip 300 may be in contact (e.g., in direct contact) with the top surface of the first semiconductor chip 200. For example, the first dummy pads 358 may be provided between the bottom surface of the second semiconductor chip 300 and the top surface of the first semiconductor chip 200. On the top surface of the first semiconductor chip 200, the first dummy pads 358 may support the second semiconductor chip 300.

As shown in FIGS. 8 and 9, the first lateral surface 200a of the first semiconductor chip 200 may be positioned in the first direction D1 of the window region WRG.

As illustrated in FIG. 8, a distance between the window region WRG and the first signal pads 356 may be less on the third lateral surface 200c of the first semiconductor chip 200 than on the first lateral surface 200a of the first semiconductor chip 200. For example, the window region WRG may partially overlap the first semiconductor chip 200, and a reduced length may be provided between the first signal pads 356 and the window region WRG that does not overlap the first semiconductor chip 200. Therefore, a reduced length may be given to the first wiring pattern 354 that connects the first signal pads 356 to the second chip pads 316, a semiconductor package may be provided to have improved electrical properties.

In some example embodiments, as illustrated in FIG. 9, the first signal pads 356 may constitute at least one column that extends along the first and third lateral surfaces 200a and 200c of the first semiconductor chip 200 on the first region RG1'. For example, the first signal pads 356 adjacent to the first lateral surface 200a of the first semiconductor chip 200 may be arranged along the second direction D2, and the first signal pads 356 adjacent to the third lateral surface 200c of the first semiconductor chip 200 may be arranged in the first direction D1. In this case, as the first signal pads 356 are arranged around the first semiconductor chip 200 and along the first and third lateral surfaces 200a and 200c of the first semiconductor chip 200, the first signal pads 356 may have high integration, and a semiconductor package may be provided to have a compact size and high integration.

Figure 10:
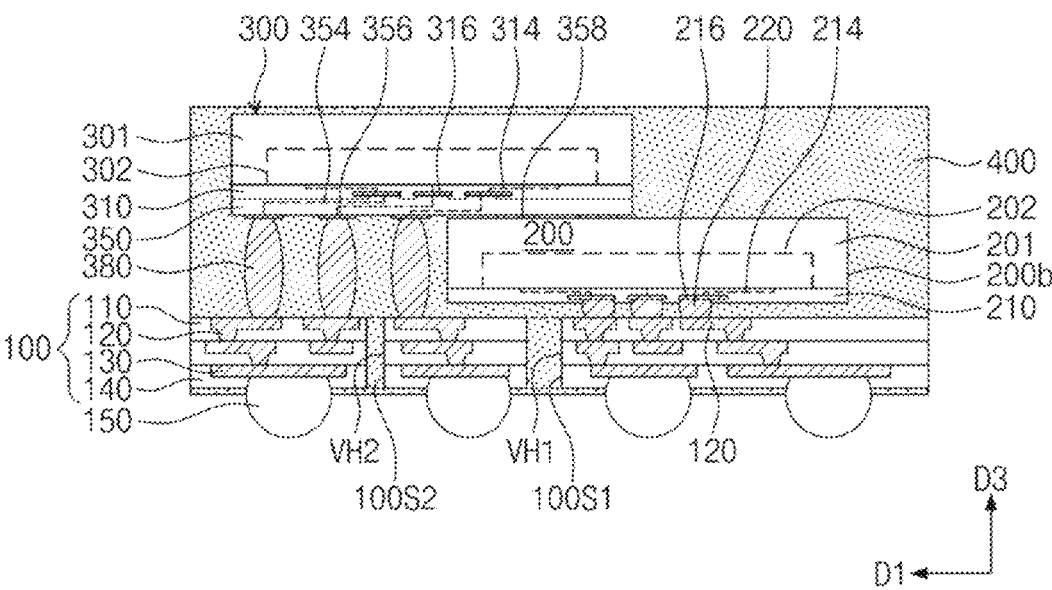
FIG. 10 illustrates a cross-sectional view showing a semiconductor package according to some example embodiments of the present inventive concepts.
Figure 11:
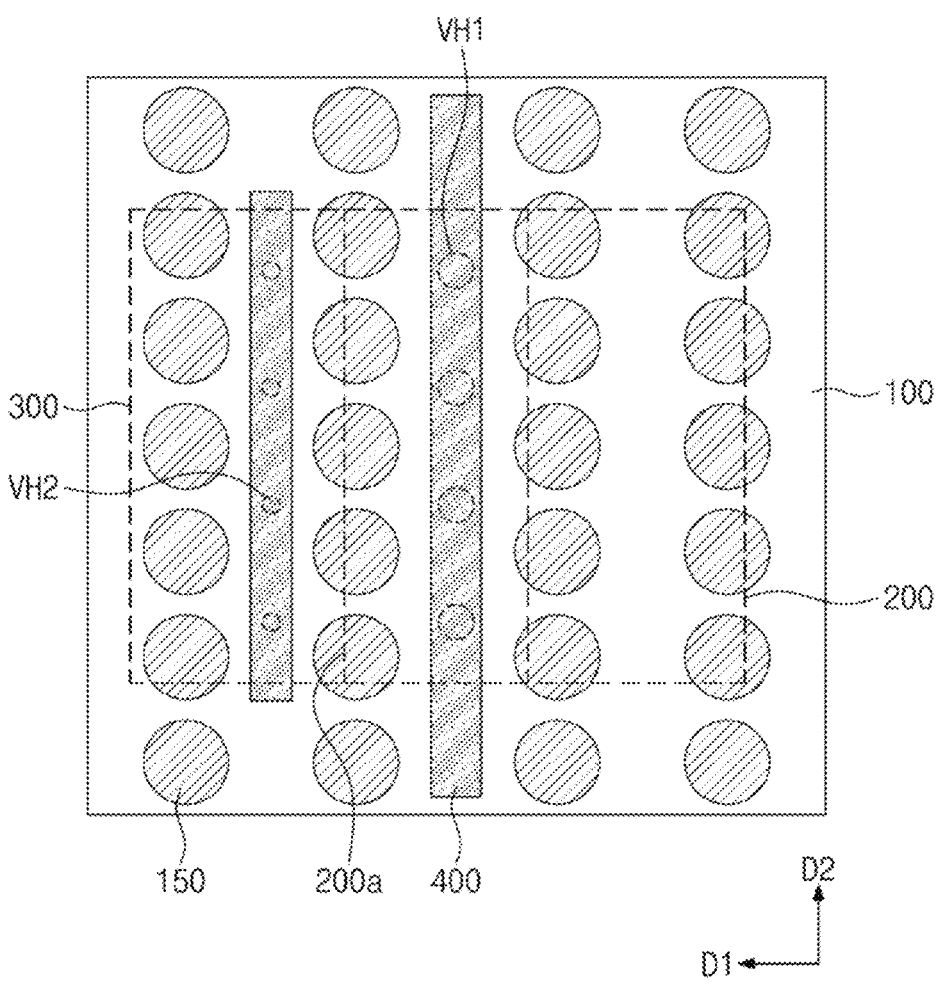
FIGS. 11 and 12 illustrate plan views showing an arrangement of via holes.
Figure 12:
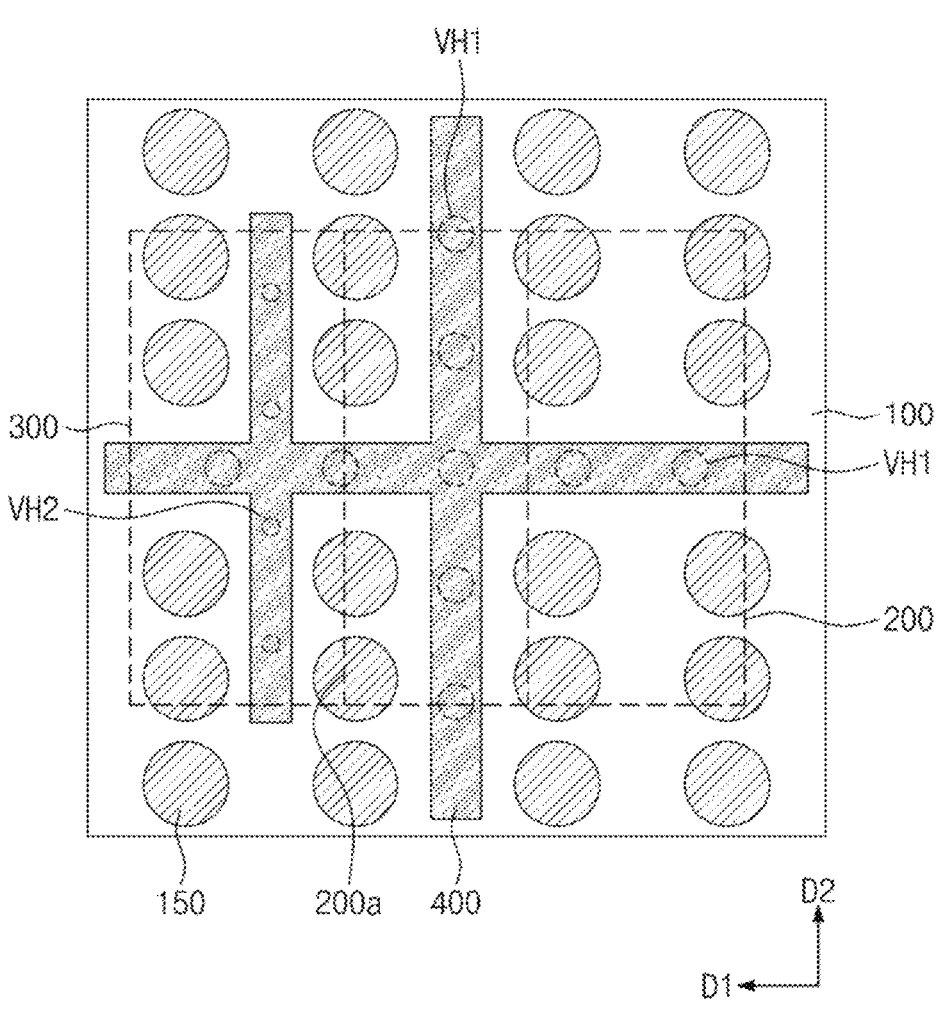

FIG. 10 illustrates a cross-sectional view showing a semiconductor package according to some example embodiments of the present inventive concepts. FIGS. 11 and 12 illustrate plan views showing an arrangement of via holes.

Referring to FIG. 10, the package substrate 100 may have vent holes VH1 and VH2. For example, as shown in FIG. 10, the package substrate 100 may have inner surfaces 100S1 and 100S2 that respectively define the vent holes WH1 and VH2 extending through the thickness of the package substrate 100 in the third direction D3. The vent holes VH1 and VH2 may vertically penetrate the package substrate 100 to extend from the top to bottom surfaces of the package substrate 100. The vent holes VH1 and VH2 may be provided on a central portion of the package substrate 100. The vent holes VH1 and VH2 may include first vent holes VH1 provided below the first semiconductor chip 200 (e.g., vertically overlapping the first semiconductor chip 200 in the third direction D3 as shown in FIGS. 10-11) and second vent holes VH2 provided below the second semiconductor chip 300 (e.g., vertically overlapping the second semiconductor chip 300 in the third direction D3 as shown in FIGS. 10-11). The vent holes VH1 and VH2 may be positioned between the external terminals 150. The vent holes VH1 and VH2 may each have a width of about 100 μm to about 300 μm.

The first vent holes VH1 may be disposed spaced apart from each other When viewed in a plan view, the first vent holes VH1 may be arranged at a regular interval. As shown in FIG. 11, the first vent holes VH1 may be arranged in the second direction D2. In some example embodiments, as shown in FIG. 12, the first vent holes VH1 may be arranged along the first and second directions D1 and D2. In this case, when viewed in a plan view, the first vent holes VH1 may constitute at least one column and at least one row. For example, the first vent holes VH1 may be arranged in a cross shape, a tetragonal lattice shape (or grid shape), or a hexagonal lattice shape (or honeycomb shape).

The second vent holes VH2 may be disposed spaced apart from each other When viewed in a plan view, the second vent holes VH2 may be arranged at a regular interval. The second vent holes VH2 may be arranged along a lateral surface of the first semiconductor chip 200. For example, as shown in FIGS. 11 and 12, the second vent holes VH2 may be arranged in the second direction D2. For another example, the second vent holes VH2 may be arranged in a grid shape having a plurality of columns and rows along the first and second directions D1 and D2.

The present inventive concepts, however, are not limited thereto, and the vent holes VH1 and VH2 may be arranged in various shapes. In addition, the vent holes VH1 and VH2 may be arranged at an irregular period. For example, the vent holes VH1 and VH2 may be provided to have no specific regularity. According to some example embodiments, either the first vent holes VH1 or the second vent holes VH2 may be omitted.

The molding layer 400 may fill a space between the package substrate 100 and the first semiconductor chip 200. A portion of the molding layer 400 may extend onto a bottom surface of the package substrate 100 from the space between the package substrate 100 and the first semiconductor chip 200. The molding layer 400 may have an extension at its portion formed of a molding member that flows through the vent holes VH1 and VH2 onto the bottom surface of the package substrate 100. The molding layer 400 may extend from the space between the package substrate 100 and the first semiconductor chip 200 through the vent holes VH1 and VH2 of the package substrate 100 onto the bottom surface of the package substrate 100. The molding layer 400, as shown in FIG. 10, may entirely cover the bottom surface of the package substrate 100. In this case, the molding layer 400 may serve as a passivation layer that protects the bottom surface of the package substrate 100. In some example embodiments, the molding layer 400 may cover a portion of the bottom surface of the package substrate 100. A planar shape of the molding layer 400 on the bottom surface of the package substrate 100 may depend on the arrangement of the vent holes VH1 and VH2. For example, when the vent holes VH1 and VH2 are arranged along the second direction D2 as shown in FIG. 11, the molding layer 400 on the bottom surface of the package substrate 100 may have a linear shape that extends in the second direction D2. For another example, when the vent holes VH1 and VH2 are arranged along the first and second directions D1 and D2, the molding layer 400 on the bottom surface of the package substrate 100 may have a shape that extends in the first and second directions D1 and D2 (e.g., a cross or grid shape in the case of FIG. 12).

Figure 13:
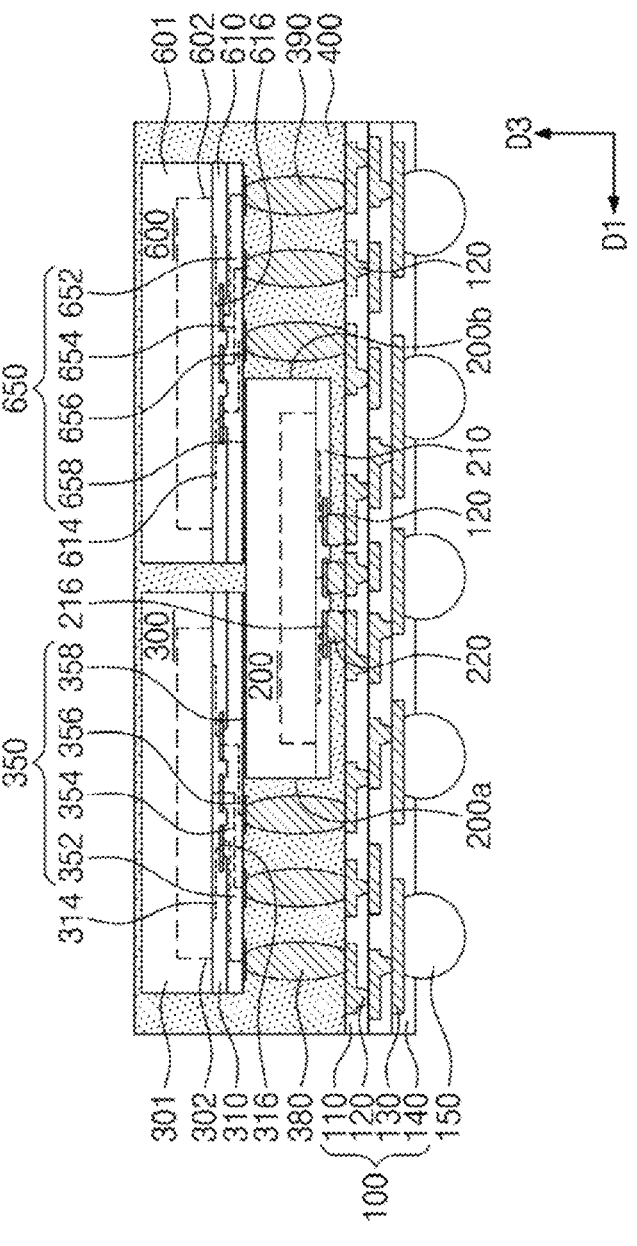
FIGS. 13, 14, and 15 illustrate cross-sectional views showing a semiconductor package according to some example embodiments of the present inventive concepts.

FIG. 13 illustrates a cross-sectional view showing a semiconductor package according to some example embodiments of the present inventive concepts.

Referring to FIG. 13, a third semiconductor chip 600 may be disposed on the first semiconductor chip 200. The third semiconductor chip 600 may be disposed on the rear surface of the first semiconductor chip 200. The third semiconductor chip 600 and the first semiconductor chip 200 may be disposed in an offset stack structure. For example, the first semiconductor chip 200 and the third semiconductor chip 600 may be stacked obliquely in a direction reverse to the first direction D1, which may result in an ascending stepwise shape. In some example embodiments, a portion of the third semiconductor chip 600 may overlap the first semiconductor chip 200, and another portion of the third semiconductor chip 600 may protrude beyond one lateral surface of the first semiconductor chip 200. The third semiconductor chip 600 may protrude beyond the second lateral surface 200b of the first semiconductor chip 200. For example, when viewed in a plan view, the third semiconductor chip 600 may be stacked on the first semiconductor chip 200 such that the third semiconductor chip 600 may be shifted (e.g., offset) from the first semiconductor chip 200 in a direction reverse to the first direction D1. A front surface, or a bottom surface, of the third semiconductor chip 600 may be parallel or substantially parallel to the top surface of the package substrate 100.

The third semiconductor chip 600 may be configured identical or substantially identical or similar to the second semiconductor chip 300. For example, the third semiconductor chip 600 may be of the same type as the second semiconductor chip 300. For example, the third semiconductor chip 600 may be a memory chip, such as dynamic random-access memory (DRAM), static random access memory (SRAM), magnetic random access memory (MRAM), or Flash memory. In some example embodiments, the third semiconductor chip 600 may be a logic chip, a passive device, or any other suitable semiconductor chip. The third semiconductor chip 600 may include a semiconductor material, such as silicon (Si). For example, the third semiconductor chip 600 may include a third base layer 601 where is formed a third integrated circuit 602 of the third semiconductor chip 600, and may also include a third chip wiring layer 610 disposed on one surface on which the third integrated circuit 602 is formed in the third base layer 601. The third chip wiring layer 610 may include a third chip dielectric pattern, a third chip wiring pattern 614 in the third chip dielectric pattern, third chip pads 616 connected to the third chip wiring pattern 614, and a third chip passivation layer that encapsulates the third chip wiring pattern 614 and the third chip pads 616 on the third chip dielectric pattern and exposes the third chip pads 616.

The third semiconductor chip 600 may further include a second redistribution layer 650 provided on the front surface of the third semiconductor chip 600. For example, the second redistribution layer 650 may be provided on the bottom surface of the third semiconductor chip 600, and may cover the third base layer 601 and the third chip wiring layer 610. The second redistribution layer 650 may include a second dielectric pattern 652 stacked on the bottom surface of the third semiconductor chip 600, a second wiring pattern 654 provided in the second dielectric pattern 652, and second signal pads 656 and second dummy pads 658 exposed on a bottom surface of the second redistribution layer 650.

The third semiconductor chip 600 may be flip-chip mounted on the package substrate 100. For example, second connection terminals 390 may be provided between second signal pads 656 and the package substrate 100. The third semiconductor chip 600 may be connected to the package substrate 100 through the second signal pads 656, the second connection terminals 390, and the substrate wiring pattern 120. The second connection terminals 390 may be disposed on one side in a direction reverse to the direction D1 from the first semiconductor chip 200. For example, the second connection terminals 390 may be disposed adjacent to the second lateral surface 200*b* of the first semiconductor chip 200. The second connection terminals 390 may be correspondingly provided on the second signal pads 656. An arrangement of the second connection terminals 390 may conform to that of the second signal pads 656. For example, the second connection terminals 390 may constitute at least one column that extends along the second direction D2. The second connection terminals 390 may be coupled to the substrate wiring pattern 120 of the package substrate 100. Therefore, the third integrated circuit 602 of the third semiconductor chip 600 may be electrically connected to the package substrate 100 through the second redistribution layer 650, the second signal pads 656, and the second connection terminals 390. The second connection terminals 390 may include a solder ball or a solder bump. For example, the second connection terminals 390 may be solder balls each having a composite structure that includes a core portion formed of metal and a peripheral portion surrounding the core portion.

According to some example embodiments of the present inventive concepts, as the second and third semiconductor chips 300 and 600 are disposed to vertically overlap the first semiconductor chip 200, the first, second, and third semiconductor chips 200, 300, and 600 may have a reduced occupying planar area and a compact-sized semiconductor package may be provided.

Figure 14:
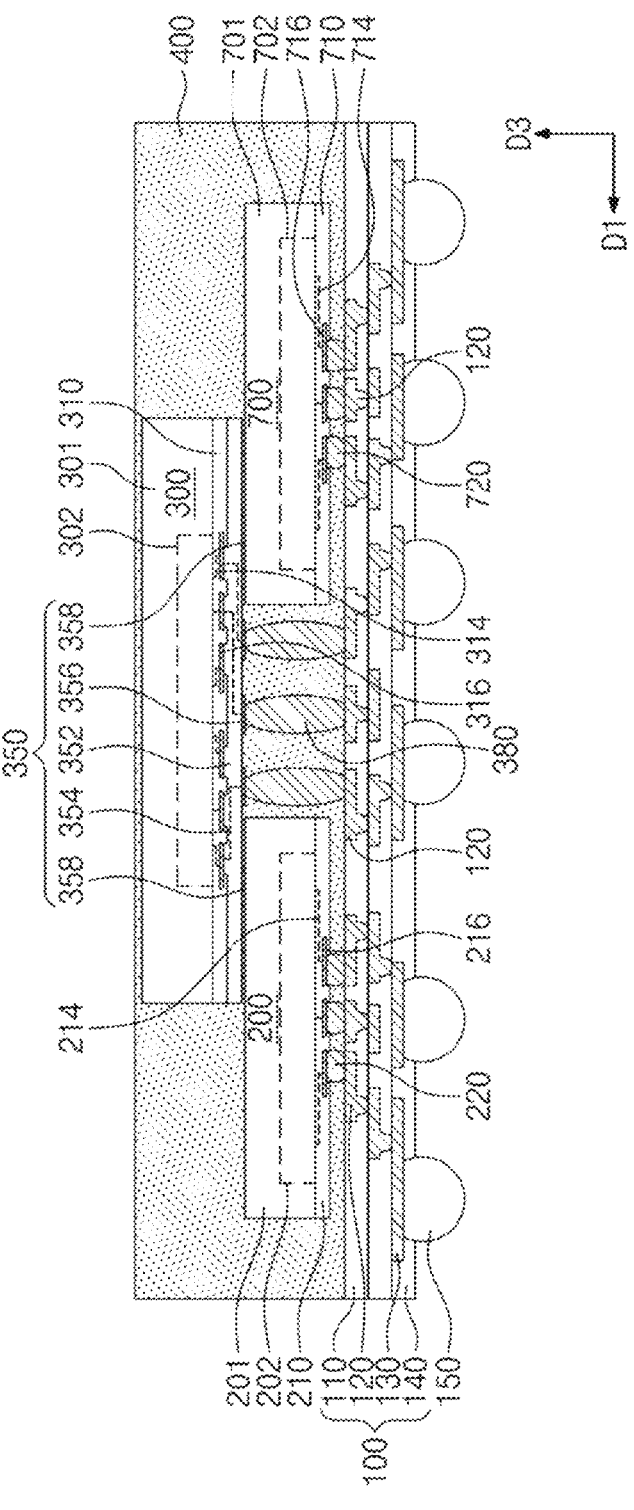

FIG. 14 illustrates a cross-sectional view showing a semiconductor package according to some example embodiments of the present inventive concepts.

Referring to FIG. 14, a fourth semiconductor chip 700 may be disposed on the package substrate 100. The fourth semiconductor chip 700 may be horizontally spaced apart from the first semiconductor chip 200. The fourth semiconductor chip 700 may be disposed on one side in the first direction D1 of the first semiconductor chip 200. In this case, the first connection terminals 380 may be provided between the first semiconductor chip 200 and the fourth semiconductor chip 700.

The fourth semiconductor chip 700 may be configured identical or substantially identical or similar to the first semiconductor chip 200. For example, the fourth semiconductor chip 700 may be of the same type as the first semiconductor chip 200. For example, the fourth semiconductor chip 700 may be a memory chip, such as dynamic random-access memory (DRAM), static random access memory (SRAM), magnetic random access memory (MRAM), or Flash memory. In some example embodiments, the fourth semiconductor chip 700 may be a logic chip, a passive device, or any other suitable semiconductor chip. The fourth semiconductor chip 700 may include a semiconductor material, such as silicon (Si). For example, the fourth semiconductor chip 700 may include a fourth base layer 701 where is formed a fourth integrated circuit 702 of the fourth semiconductor chip 700, and may also include a fourth chip wiring layer 710 disposed on one surface on which the fourth integrated circuit 702 is formed in the fourth base layer 701. The fourth chip wiring layer 710 may include a fourth chip dielectric pattern, a fourth chip wiring pattern 714 in the fourth chip dielectric pattern, fourth chip pads 716 connected to the fourth chip wiring pattern 714, and a fourth chip passivation layer that encapsulates the fourth chip wiring pattern 714 and the fourth chip pads 716 on the fourth chip dielectric pattern and exposes the fourth chip pads 716 The fourth chip pads 716 may include a metallic material, such as aluminum (Al).

The fourth semiconductor chip 700 may be flip-chip mounted on the package substrate 100. For example, the fourth semiconductor chip 700 may be disposed to allow the fourth chip pads 716 to face the package substrate 100. A plurality of second chip terminals 720 may be provided between the fourth chip pads 716 and the package substrate 100. The second chip terminals 720 may penetrate the fourth passivation layer and may be coupled to the fourth chip pads 716. The fourth semiconductor chip 700 may be connected to the package substrate 100 through the fourth chip pads 716, the second chip terminals 720, and the substrate wiring pattern 120.

The second semiconductor chip 300 may be disposed on the first semiconductor chip 200 and the fourth semiconductor chip 700. The second semiconductor chip 300 may be positioned on the rear surface of the first semiconductor chip 200 and a rear surface of the fourth semiconductor chip 700. The second semiconductor chip 300 may have one portion that overlaps the first semiconductor chip 200 and another portion that overlaps the fourth semiconductor chip 700. The second semiconductor chip 300 may have a central portion that is positioned between the one portion and the another portion of the second semiconductor chip 300, and the central portion of the second semiconductor chip 300 may be located on the first connection terminals 380.

The second semiconductor chip 300 may be flip-chip mounted on the package substrate 100. For example, the second semiconductor chip 300 may be disposed to allow the first signal pads 356 of the first redistribution layer 350 to face the package substrate 100. The second semiconductor chip 300 may be connected to the package substrate 100 through the second chip pads 316, the first signal pads 356, and the substrate wiring pattern 120.

The first dummy pads 358 may be provided between the second semiconductor chip 300 and the rear surface of the first semiconductor chip 200 and between the second semiconductor chip 300 and the rear surface of the fourth semiconductor chip 700. The first dummy pads 358 may support the second semiconductor chip 300 on the rear surface of the first semiconductor chip 200 and on the rear surface of the fourth semiconductor chip 700. Each of the first dummy pads 358 may be in direct contact with the rear surface of the first semiconductor chip 200 or the rear surface of the fourth semiconductor chip 700.

According to some example embodiments of the present inventive concepts, as the second semiconductor chip 300 is disposed to vertically overlap the first and fourth semiconductor chips 200 and 700, a semiconductor package may be provided to have a compact size. In addition, as the second semiconductor chip 300 is supported by both of the first and fourth semiconductor chips 200 and 700, a semiconductor package may increase in structural stability.

Figure 15:
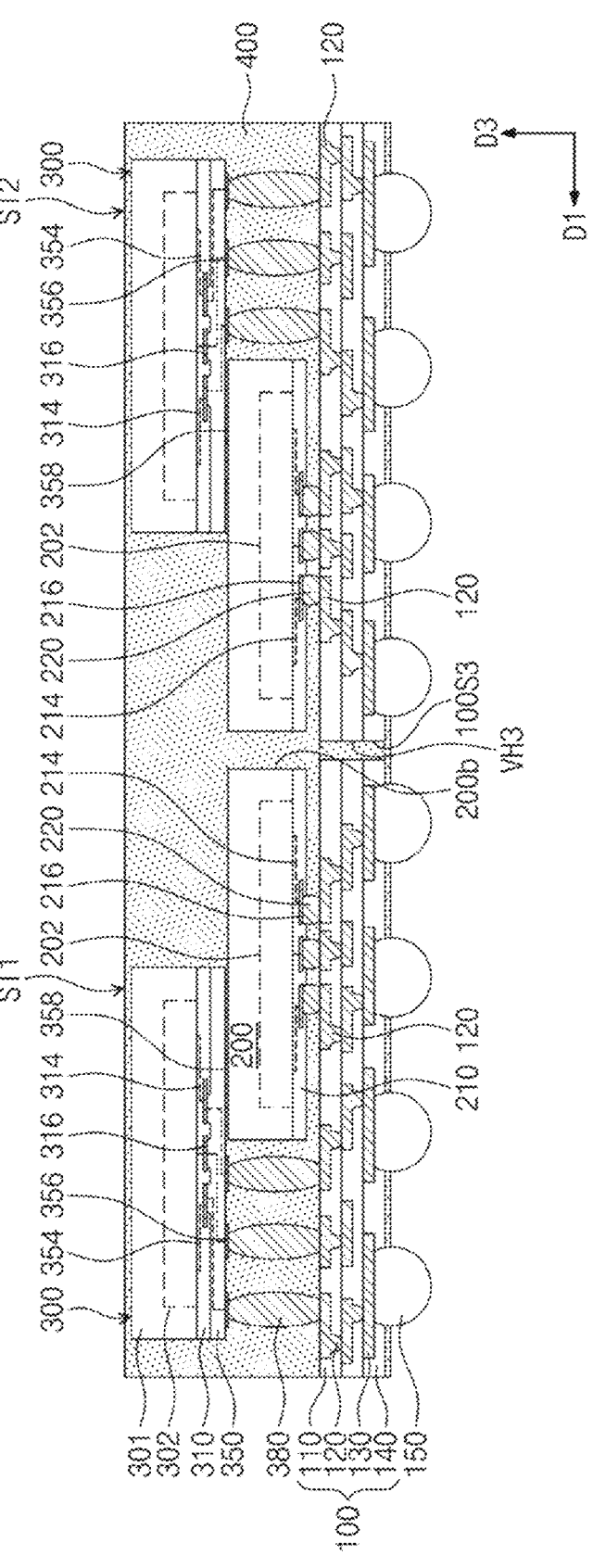

FIG. 15 illustrates a cross-sectional view showing a semiconductor package according to some example embodiments of the present inventive concepts.

Referring to FIG. 15, a package substrate 100 may be provided thereon with a first chip stack ST1 and a second chip stack ST2.

The package substrate 100 may include one or more substrate wiring layers that are stacked on each other. Each of the substrate wiring layers may include a substrate dielectric layer 110 and a substrate wiring pattern 120 in the substrate dielectric layer 110.

Each of the first and second chip stacks ST1 and ST2 may include a first semiconductor chip 200 mounted on the package substrate 100, a second semiconductor chip 300 on the first semiconductor chip 200, and first connection terminals 380 that connect the second semiconductor chip 300 to the package substrate 100.

The first semiconductor chip 200, the second semiconductor chip 300, and the first connection terminals 380 may be configured identical or similar to those discussed with reference to FIGS. 1 to 9. For example, the first semiconductor chips 200 may be flip-chip mounted on the package substrate 100. The first semiconductor chips 200 may be provided thereon with the second semiconductor chip 300 that are horizontally shifted from the first semiconductor chips 200. For example, one of the first semiconductor chip 200 and one of the second semiconductor chips 300 may be disposed in an offset stack structure, and each of the offset stack structures may correspond to either the first chip stack ST1 or the second chip stack ST2. The second semiconductor chips 300 may be configured identical or substantially identical to the first semiconductor chips 200, and may further include their first redistribution layers 350 compared to the first semiconductor chips 200. The first redistribution layer 350 may include a first dielectric pattern 352 stacked on the bottom surface of the second semiconductor chip 300, a first wiring pattern 354 provided in the first dielectric pattern 352, and first signal pads 356 and first dummy pads 358 exposed on a bottom surface of the first redistribution layer 350. A plurality of first connection terminals 380 may be provided between the first signal pads 356 and the package substrate 100. The second semiconductor chip 300 may be connected to the package substrate 100 through the first signal pads 356, the first connection terminals 380, and the substrate wiring pattern 120.

The first chip stack ST1 and the second chip stack ST2 may be spaced apart from each other on the package substrate 100. The first chip stack ST1 and the second chip stack ST2 may be disposed to allow the second lateral surfaces 200b of the first semiconductor chip 200 to face each other. For example, the first semiconductor chips 200 may be disposed on the central portion of the package substrate 100, and the first connection terminals 380 may be disposed on an outer portion of the package substrate 100. An interval between the first and second chip stacks ST1 and ST2 may range from about 100 μm to about 300 μm. For example, a range of about 100 μm to about 300 μm may be given as an interval between the second lateral surfaces 200b of the first semiconductor chips 200 of the first and second chip stacks ST1 and ST2.

The package substrate 100 may have third vent holes VH3 (e.g., may have inner surfaces 100S3 that define the third vent holes WH3 extending through the thickness of the package substrate 100). The third vent holes VH3 may vertically penetrate the package substrate 100 to extend from the top to bottom surfaces of the package substrate 100. The third vent holes VH3 may be provided on the central portion of the package substrate 100. When viewed in a plan view, the third vent holes VH3 may be positioned between the first semiconductor chips 200. In some example embodiments, although not shown, vent holes may be additionally provided below the first semiconductor chips 200 or below the second semiconductor chips 300. The third vent holes VH3 may each have a width of about 100 μm to about 300 μm.

A molding layer 400 may be provided on the package substrate 100. The molding layer 400 may cover the first chip stack ST1 and the second chip stack ST2. The molding layer 400 may extend from the package substrate 100 through the third vent holes VH3 of the package substrate 100 onto the bottom surface of the package substrate 100.

FIGS. 16, 17, 18, 19, 20, 21, and 22 illustrate cross-sectional views showing a method of fabricating a semiconductor package according to some example embodiments of the present inventive concepts.

Figure 16:
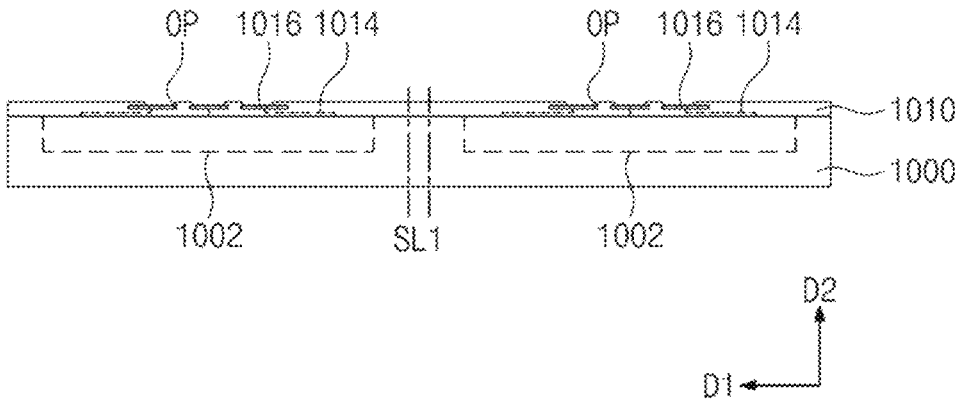
FIGS. 16, 17, 18, 19, 20, 21, and 22 illustrate cross-sectional views showing a method of fabricating a semiconductor package according to some example embodiments of the present inventive concepts.

Referring to FIG. 16, there may be formed first and second semiconductor chips 200 and 300 of FIG. 1. FIG. 16 depicts the formation of the first semiconductor chip 200 or the second semiconductor chip 300, and it is assumed that the first and second semiconductor chips 200 and 300 are of the same type as each other. The first semiconductor chip 200 may be same as that discussed with reference to FIGS. 1 to 5. For example, integrated circuits 1002 may be formed on a semiconductor wafer 1000. The semiconductor wafer 1000 may have a top surface as an active surface. A chip wiring layer 1010 may be formed on the top surface of the semiconductor wafer 1000. For example, the formation of the chip wiring layer 1010 may include forming a dielectric pattern on the active surface of the semiconductor wafer 1000, forming a wiring pattern 1014 that penetrates the dielectric pattern and connect with the integrated circuits 1002, forming on the dielectric pattern a plurality of chip pads 1016 that are connected to the wiring pattern 1014, forming on the dielectric pattern a passivation layer that covers the chip pads 1016, and patterning the passivation layer to form openings OP that partially expose top surfaces of the chip pads 1016. The chip pads 1016 may correspond to the first chip pads (see 216 of FIG. 1) of the first semiconductor chip 200 or the second chip pads (see 316 of FIG. 1) of the second semiconductor chip 300.

Afterwards, the semiconductor wafer 1000 may undergo a singulation process performed along a first sawing line SL1, and may thus be separated into the first semiconductor chips 200.

Figure 17:
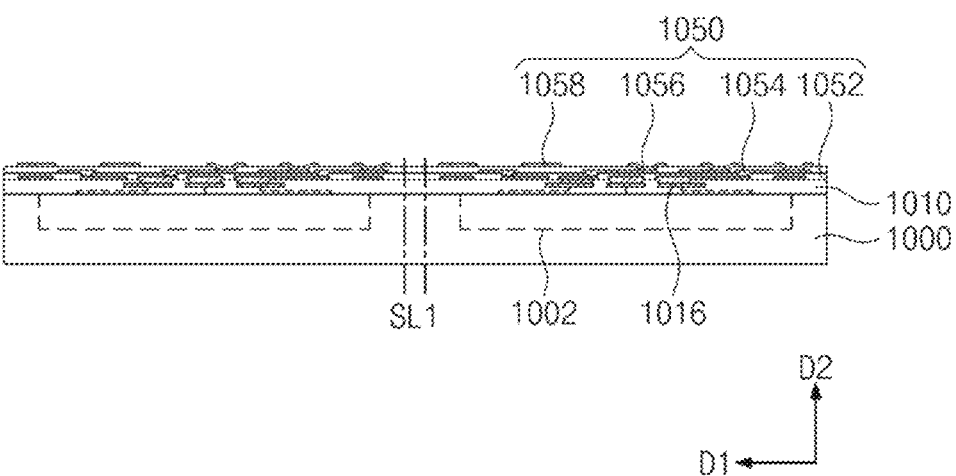

Referring to FIG. 17, a redistribution layer 1050 may be formed before the singulation process is performed on the semiconductor wafer 1000 of FIG. 16. For example, a conductive material may be coated on the top surface of the semiconductor wafer 1000 or a top surface of the chip wiring layer 1010, and the coated conductive material may be patterned to form a wiring pattern 1054. The wiring pattern 1054 may penetrate the openings (see OP of FIG. 16) and may be coupled to the chip pads 1016. The chip wiring layer 1010 may be coated thereon with a dielectric material to form a dielectric pattern 1052 that encapsulates the wiring pattern 1054. In some example embodiments, the chip wiring layer 1010 may be coated on its top surface with a dielectric material to form the dielectric pattern 1052, and then the wiring pattern 1054 may be formed to penetrate the dielectric pattern 1052 and the passivation layer and may be coupled to the chip pads 1016. The formation of the wiring pattern 1054 and the formation of the dielectric pattern 1052 may be repeatedly performed to form wiring layers that are stacked on each other. After that, signal pads 1056 and dummy pads 1058 may be formed on the dielectric pattern 1052, thereby being coupled to the wiring pattern 1054. For example, the dielectric pattern 1052 may be patterned to form holes that expose the wiring pattern 1054, a metal layer may be formed on the dielectric pattern 1052, and then the metal layer may be patterned to form the signal pads 1056 that are coupled through the holes to the wiring pattern 1054 and to form the dummy pads 1058 that are disposed on a top surface of the dielectric pattern 1052. The signal pads 1056 and the dummy pads 1058 may be components formed in one process. The signal pads 1056 and the dummy pads 1058 may have their top surfaces located at the same level from the top surface of the semiconductor wafer 1000. The redistribution layer 1050 may correspond to the first redistribution layer (see 350 of FIG. 1) of the second semiconductor chip 300. For example, the dielectric pattern 1052 may correspond to the first dielectric pattern (see 352 of FIG. 2) of the first redistribution layer 350, the wiring pattern 1054 may correspond to the first wiring pattern (see 354 of FIG. 2) of the first redistribution layer 350, the signal pads 1056 may correspond to the first signal pads (see 356 of FIG. 2) of the first redistribution layer 350, and the dummy pads 1058 may correspond to the first dummy pads (see 358 of FIG. 2) of the first redistribution layer 350.

Afterwards, the semiconductor wafer 1000 may undergo a singulation process performed along the first sawing line SL1, and may thus be separated into the second semiconductor chips 300.

Figures 18, 19:
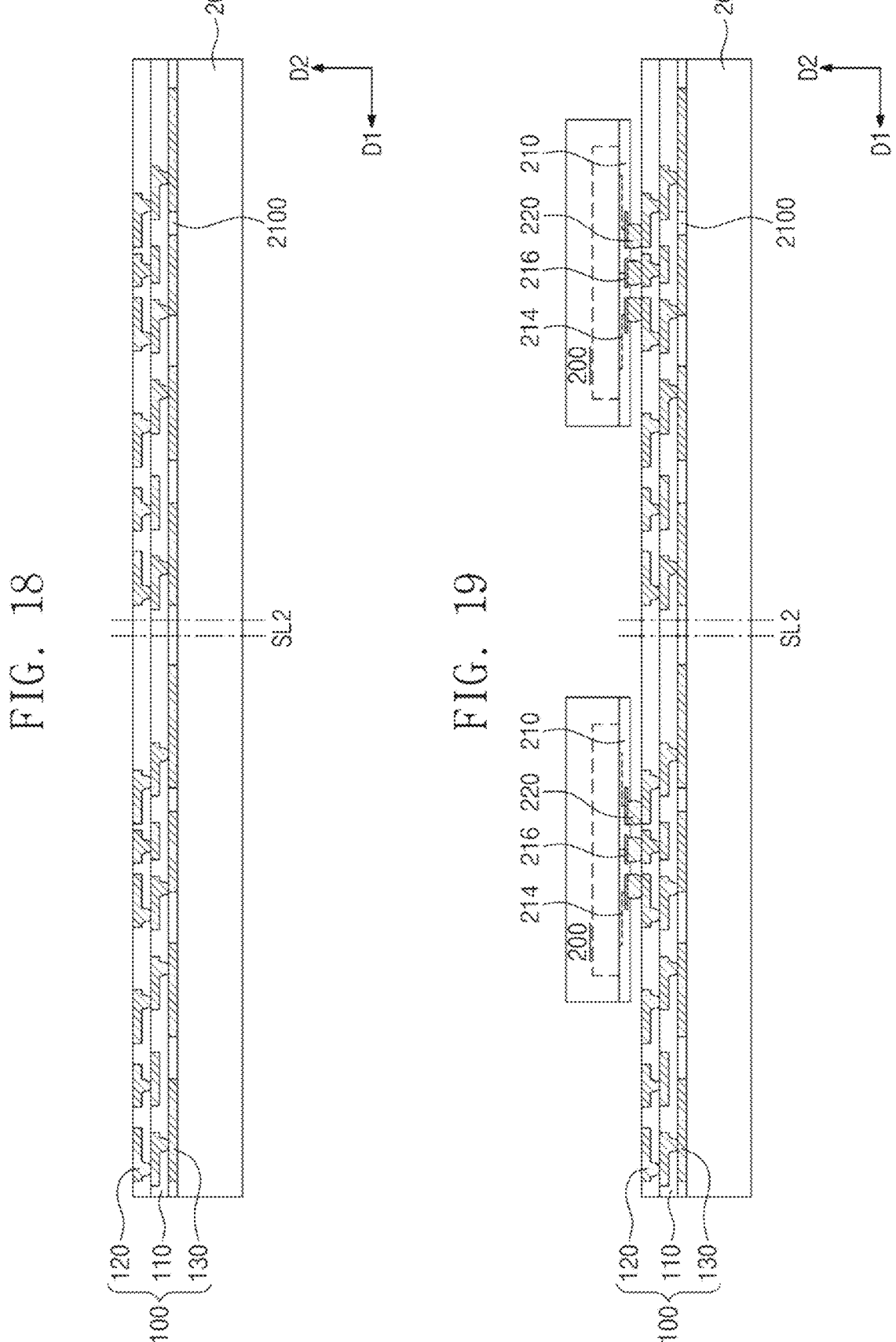

Referring to FIG. 18, a carrier substrate 2000 may be provided. The carrier substrate 2000 may be a dielectric substrate including glass or polymer, or may be a conductive substrate including metal. Although not shown, the carrier substrate 2000 may be provided with an adhesive member on a top surface of the carrier substrate 2000. For example, the adhesive member may include a glue tape.

A package substrate 100 may be formed on the carrier substrate 2000. The following will describe in detail the formation of the package substrate 100.

A lower dielectric layer 2100 may be provided on the carrier substrate 2000. The lower dielectric layer 2100 may include a dielectric polymer or a photosensitive polymer.

A plurality of external pads 130 may be formed in the lower dielectric layer 2100. For example, the lower dielectric layer 2100 may be patterned to form openings for forming the external pads 130, a seed layer may be conformally formed in the openings, and then performing an electroplating process in which the seed layer is used as a seed to form the external pads 130 that fill the openings.

A substrate dielectric layer 110 may be formed on the lower dielectric layer 2100. The substrate dielectric layer 110 may be formed by a coating process such as spin coating or slit coating. The substrate dielectric layer 110 may include a photo-imageable dielectric (PID). For example, the photo-imageable dielectric polymer may include at least one selected from photosensitive polyimide, polybenzoxazole (PBO), phenolic polymers, and benzocyclobutene polymers.

A substrate wiring pattern 120 may be formed. For example, the substrate dielectric layer 110 may be patterned to form openings that expose the external pads 130, a barrier layer and a conductive layer may be formed on the substrate dielectric layer 110 so as to fill the openings, and then the barrier layer and the conductive layer may undergo a planarization process to form the substrate wiring pattern 120.

A substrate wiring layer may be formed which includes the substrate dielectric layer 110 and the substrate wiring pattern 120. The formation of the substrate wiring layer may be repeated to form the package substrate 100 in which the substrate wiring layers are stacked. The substrate wiring pattern 120 of an uppermost substrate wiring layer may correspond to a substrate pad of the package substrate 100.

Referring to FIG. 19, the first semiconductor chips 200 may be mounted on the package substrate 100. For example, solder balls may be provided on the first chip pads 216 of the first semiconductor chips 200. The first semiconductor chips 200 may be positioned on the package substrate 100 so as to allow the first chip pads 216 to align with the substrate wiring pattern 120 of the package substrate 100. After that, the first semiconductor chips 200 may descend to allow the solder balls to contact the substrate wiring pattern 120, and then the solder ball may undergo a reflow process to form first chip terminals 220 that connect the first semiconductor chip 200 to the package substrate 100.

Figure 20:
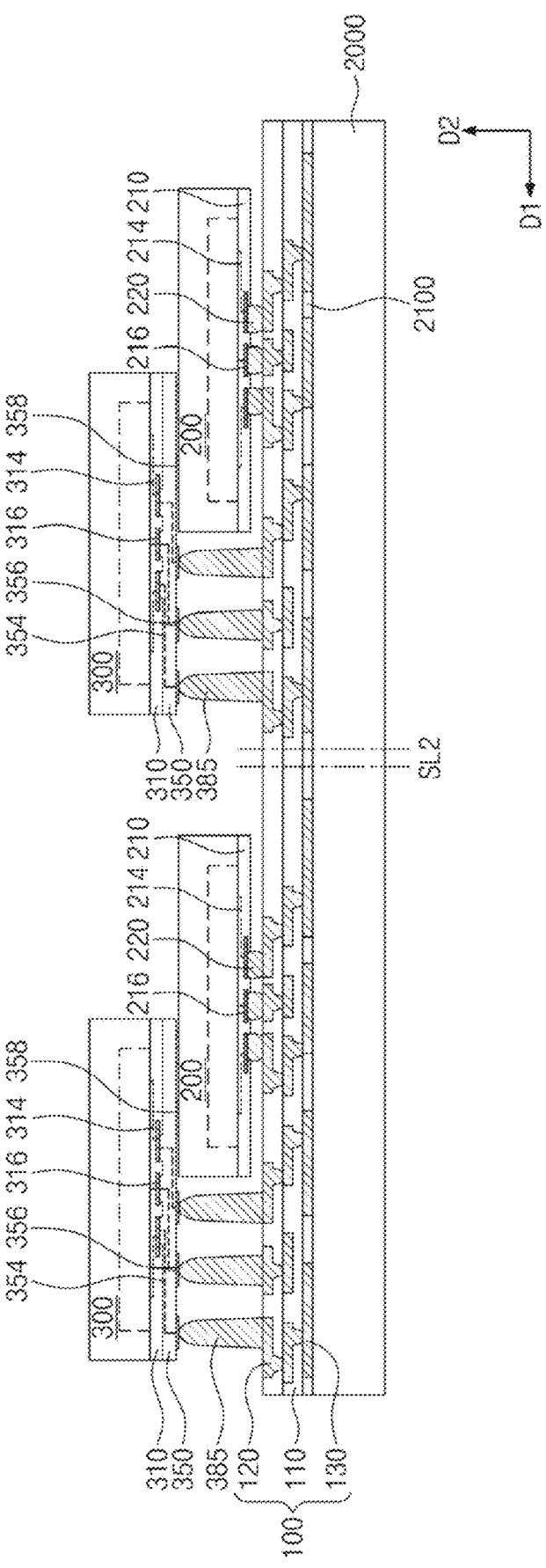

Referring to FIG. 20, the second semiconductor chips 300 may be provided on the package substrate 100. For example, solders 385 may be provided on the substrate wiring pattern 120 positioned on one side of each of the first semiconductor chips 200. The solders 385 may be coupled to the substrate wiring pattern 120. The solders 385 may have their top ends located at a level the same as or higher than that of a top surface of the first semiconductor chip 200. The solders 385 may include a solder ball or a solder bump. For example, the solders 385 may be solder balls each having a composite structure that includes a core portion formed of metal and a peripheral portion surrounding the core portion.

According to some example embodiments of the present inventive concepts, the solders 385 may each include therein the core portion whose melting point is high, and on the substrate wiring pattern 120, the core portion may support the peripheral portion. Even when the solders 385 have their large heights, the core portions may prevent the solders 385 or the peripheral portions from running down or collapse toward one side.

The second semiconductor chip 300 may be positioned on the package substrate 100 to allow the first signal pads 356 to align with the solders 385, which first signal pads 356 are included in the first redistribution layer 350 of the second semiconductor chip 300.

Figure 21:
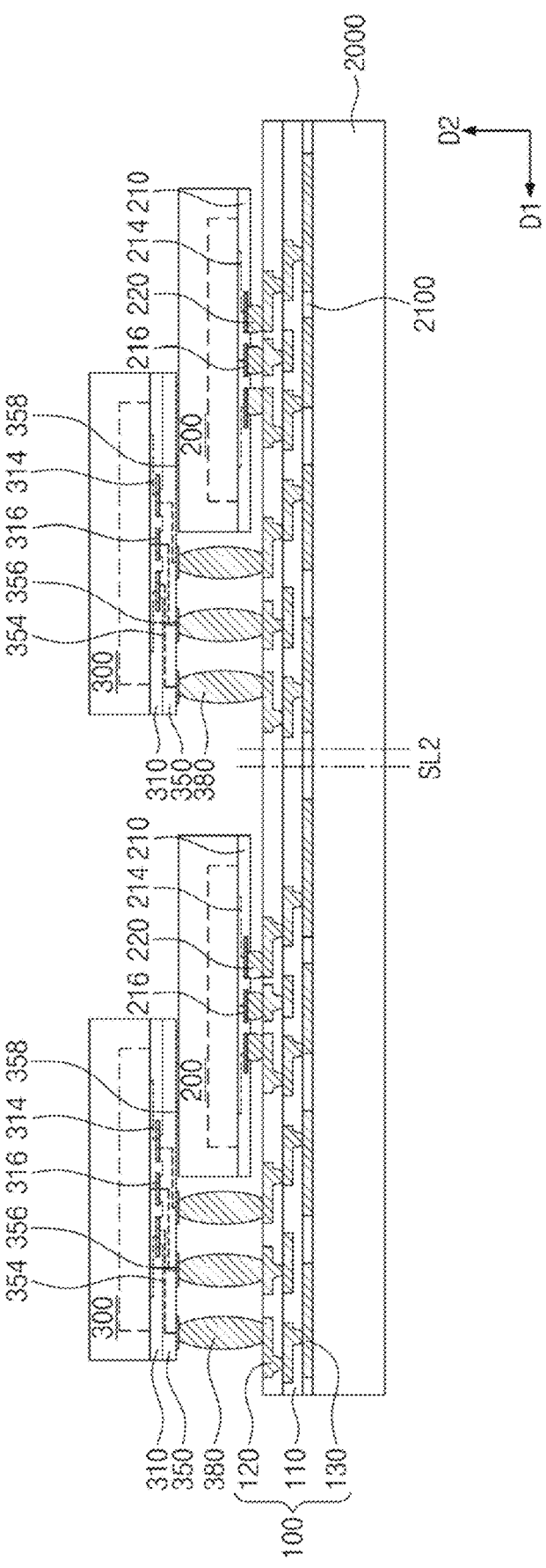

Referring to FIG. 21, the second semiconductor chip 300 may descend to allow the first signal pads 356 to contact the solders 385, and then the solders 385 may undergo a reflow process to form first connection terminals 380 that connect the second semiconductor chip 300 to the package substrate 100. The first connection terminals 380 may cause the second semiconductor chip 300 and the package substrate 100 to connect with each other on one side of the first semiconductor chip 200.

According to some example embodiments of the present inventive concepts, as the core portions of the solders 385 support the peripheral portions on the substrate wiring pattern 120, even though a large distance is provided between the package substrate 100 and the second semiconductor chip 300, the second semiconductor chip 300 may be easily mounted on the package substrate 100.

Figure 22:
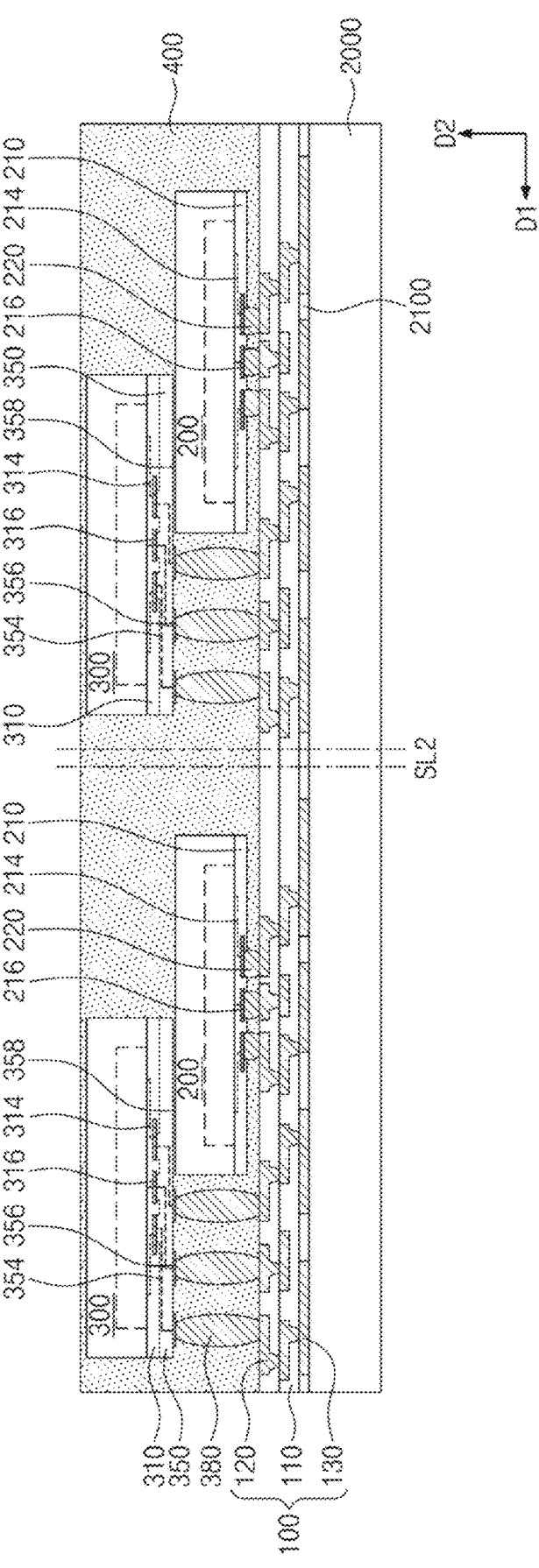

Referring to FIG. 22, a molding layer 400 may be formed on the package substrate 100. For example, the package substrate 100 may be coated on its top surface with a molding material to encapsulate the first and second semiconductor chips 200 and 300, and the molding material may be cured to form the molding layer 400. The molding layer 400 may fill a space between the package substrate 100 and the second semiconductor chip 300.

The carrier substrate 2000 may be removed. The removal of the carrier substrate 2000 may expose a bottom surface of the package substrate 100 or may expose the external pads 130 of the package substrate 100.

Referring back to FIG. 1, the lower dielectric layer 2100 may be removed, and a substrate protection layer 140 may be formed below the package substrate 100. Below the substrate dielectric layer 110, the substrate protection layer 140 may cover the substrate wiring pattern 120 and the external pads 130. In some example embodiments, a dielectric material layer may be additionally coated on the lower dielectric layer 2100. The lower dielectric layer 2100 and the dielectric material layer may form the substrate protection layer 140.

The substrate protection layer 140 may be patterned to expose the external pads 130. The external pads 130 may be provided thereon with external terminals 150. As such, it may be possible to fabricate a semiconductor package discussed with reference to FIG. 1.

Afterwards, as shown in FIG. 22, the package substrate 100 may undergo a singulation process performed along a second sawing line SL2, and may thus be separated into a plurality of semiconductor packages.

Depending on necessity, the singulation process may be performed prior to the removal of the carrier substrate 2000 and the lower dielectric layer 2100. For example, the carrier substrate 2000 may undergo a singulation process performed along the second sawing line SL2, which may result in separation of the package substrates 100, the first and second semiconductor chips 200 and 300, and the molding layers 400.

A semiconductor package according to some example embodiments of the present inventive concepts may be configured such that semiconductor chips may be disposed to vertically overlap each other to reduce an area that the semiconductor chips occupy when viewed in a plan view, with the result that the semiconductor package may become small in size. A redistribution layer may be used to form the semiconductor package having a large overlapping area between the semiconductor chips, and the semiconductor package may decrease in planar area. Therefore, the semiconductor package may become small in size.

In addition, the redistribution layer may increase the degree of freedom of electrical connection of an upper semiconductor chip, and there may be a reduced length of electrical connection between a package substrate and the semiconductor chips. Accordingly, the semiconductor package may increase in electrical properties.

Moreover, dummy pads may be used to support the upper semiconductor chip on a lower semiconductor chip, and thus the semiconductor package may have improved structural stability.

Although the present inventive concepts have been described in connection with some example embodiments of the present inventive concepts illustrated in the accompanying drawings, it will be understood by one of ordinary skill in the art that variations in form and detail may be made therein without departing from the spirit and essential feature of the present inventive concepts. The above disclosed example embodiments should thus be considered illustrative and not restrictive.

What is claimed is:

1. A semiconductor package, comprising:
   a first semiconductor chip on a package substrate;

a second semiconductor chip on the first semiconductor chip;
   a redistribution layer on a bottom surface of the second semiconductor chip;
   a plurality of under-bump pads on a bottom surface of the redistribution layer;
   a plurality of first solders adjacent to the first semiconductor chip, the plurality of first solders connecting a plurality of first pads of the plurality of under-bump pads to a plurality of substrate pads of the package substrate; and
   a molding layer on the package substrate, wherein
      the molding layer covers the first semiconductor chip, the second semiconductor chip, and the plurality of first solders,
      a plurality of second pads of the plurality of under-bump pads are in direct contact with a top surface of the first semiconductor chip,
      the plurality of first pads are connected through the redistribution layer to an integrated circuit of the second semiconductor chip,
      the plurality of second pads are insulated from the integrated circuit of the second semiconductor chip,
      the molding layer is between the first semiconductor chip and the second semiconductor chip, and
      lateral surfaces of the plurality of second pads are in direct contact with the molding layer and bottom surfaces of the plurality of second pads are in direct contact with the top surface of the first semiconductor chip.

2. The semiconductor package of claim 1, wherein the redistribution layer includes:
   a dielectric pattern that covers the bottom surface of the second semiconductor chip and a plurality of first chip pads of the second semiconductor chip; and
   a wiring pattern in the dielectric pattern, the wiring pattern being coupled to the plurality of first chip pads and electrically connected to the integrated circuit of the second semiconductor chip,
   wherein the plurality of first pads penetrate the dielectric pattern and are coupled to the wiring pattern.

3. The semiconductor package of claim 2, wherein the dielectric pattern separates the plurality of second pads from the wiring pattern.

4. The semiconductor package of claim 1, wherein
   the plurality of first pads are spaced apart from the first semiconductor chip when viewed in a plan view, and
   the plurality of second pads vertically overlap the first semiconductor chip.

5. The semiconductor package of claim 1, wherein the first semiconductor chip is coupled to the package substrate through a plurality of second solders on a plurality of second chip pads, the plurality of second chip pads being on a bottom surface of the first semiconductor chip.

6. The semiconductor package of claim 5, wherein a first height of the plurality of first solders is about 1.5 times to about 30 times a second height of the plurality of second solders.

7. The semiconductor package of claim 6, wherein
   the first height of the plurality of first solders is in a range of about 50 μm to about 300 μm, and
   the second height of the plurality of second solders is in a range of about 10 μm to about 50 μm.

8. The semiconductor package of claim 1, wherein bottom surfaces of the plurality of first pads and the bottom surfaces of the plurality of second pads are at a same level from the bottom surface of the second semiconductor chip.

9. The semiconductor package of claim 1, wherein the first semiconductor chip has a first lateral surface in a first direction and a second lateral surface in a second direction that intersects the first direction, the first lateral surface and the second lateral surface being in direct contact with each other, and when viewed in a plan view, the second semiconductor chip protrudes beyond the first lateral surface and does not protrude beyond the second lateral surface.

10. The semiconductor package of claim 9, wherein a wiring pattern of the redistribution layer is connected to the integrated circuit of the second semiconductor chip in a window region on a top surface of the redistribution layer, the window region extends in the second direction on a central portion of the redistribution layer, and the plurality of first pads are arranged along the second direction on one side in the first direction from the window region.

11. The semiconductor package of claim 1, wherein the first semiconductor chip has a first lateral surface in a first direction and a second lateral surface in a second direction that intersects the first direction, the first lateral surface and the second lateral surface being in direct contact with each other, and when viewed in a plan view, the second semiconductor chip protrudes beyond both of the first lateral surface and the second lateral surface.

12. A semiconductor package, comprising:

a package substrate;

a first semiconductor chip and a second semiconductor chip that are sequentially stacked on the package substrate;

a redistribution layer on a bottom surface of the second semiconductor chip;

a plurality of first pads on a bottom surface of the redistribution layer, and between the second semiconductor chip and the first semiconductor chip;

a molding layer on the package substrate, the molding layer covering the first semiconductor chip and the second semiconductor chip; and a plurality of external terminals on a bottom surface of the package substrate, wherein the second semiconductor chip is offset from the first semiconductor chip in a horizontal direction that is parallel to at least a top surface of the package substrate to vertically overlap a first lateral surface and a second lateral surface of the first semiconductor chip, the first lateral surface and the second lateral surface being adjacent to each other, the first semiconductor chip is on the package substrate through a plurality of first solders on a bottom surface of the first semiconductor chip such that the plurality of first solders are between the first semiconductor chip and the package substrate, the second semiconductor chip is on the package substrate through a plurality of second solders on the package substrate such that the plurality of second solders are between the second semiconductor chip and the package substrate, the plurality of second solders being adjacent to the first lateral surface and the second lateral surface of the first semiconductor chip and being spaced apart from the first semiconductor chip, the second semiconductor chip is supported on a top surface of the first semiconductor chip, the molding layer is between the first semiconductor chip and the second semiconductor chip, and lateral surfaces of the plurality of first pads are in direct contact with the molding layer and bottom surfaces of the plurality of first pads are in direct contact with the top surface of the first semiconductor chip.

13. The semiconductor package of claim 12, further comprising:

a plurality of second pads on the bottom surface of the redistribution layer, and wherein the plurality of second pads are adjacent to the first semiconductor chip and are connected through the plurality of second solders to the package substrate.

14. The semiconductor package of claim 13, wherein the bottom surfaces of the plurality of first pads and bottom surfaces of the plurality of second pads are at a same level from the bottom surface of the second semiconductor chip.

15. The semiconductor package of claim 13, wherein the plurality of second pads are spaced apart from the first semiconductor chip when viewed in a plan view, and the plurality of first pads vertically overlap the first semiconductor chip.

16. The semiconductor package of claim 13, wherein the plurality of second pads are connected through the redistribution layer to an integrated circuit of the second semiconductor chip, and the plurality of first pads are insulated from the integrated circuit of the second semiconductor chip.

17. A semiconductor package, comprising:

a substrate;

a first semiconductor chip on the substrate;

a second semiconductor chip on the first semiconductor chip and horizontally offset from the first semiconductor chip in a horizontal direction that is parallel to at least a top surface of the substrate;

a redistribution layer on a bottom surface of the second semiconductor chip and connected to an integrated circuit of the second semiconductor chip;

a dummy pad between the first semiconductor chip and the second semiconductor chip and on a bottom surface of the redistribution layer;

a signal pad on one side of the first semiconductor chip and on the bottom surface of the redistribution layer;

a connection terminal on the one side of the first semiconductor chip and between the substrate and the second semiconductor chip; and a molding layer on the substrate and covering the first semiconductor chip and the second semiconductor chip, wherein the molding layer fills both a space between the substrate and the first semiconductor chip and a space between the substrate and the second semiconductor chip, the molding layer is between the first semiconductor chip and the second semiconductor chip, the connection terminal directly connects the signal pad to a substrate pad of the substrate, and lateral surfaces of the dummy pad are in direct contact with the molding layer and bottom surfaces of the dummy pad are in direct contact with a top surface of the first semiconductor chip.

18. The semiconductor package of claim 17, wherein the second semiconductor chip is shifted from the first semiconductor chip to vertically overlap a first lateral surface and a second lateral surface of the first semiconductor chip, the first lateral surface and the second lateral surface being adjacent to each other.

19. The semiconductor package of claim 17, wherein a bottom surface of the dummy pad and a bottom surface of the signal pad are at a same level from the bottom surface of the second semiconductor chip.

20. The semiconductor package of claim 17, wherein the signal pad is connected through the redistribution layer to the integrated circuit of the second semiconductor chip, and the dummy pad is insulated from the integrated circuit of the second semiconductor chip.

\* \* \* \* \*